(12) United States Patent
Min

(10) Patent No.: US 12,237,386 B2
(45) Date of Patent: Feb. 25, 2025

(54) SEMICONDUCTOR DEVICE AND METHOD FOR FABRICATING THE SAME

(71) Applicant: Samsung Electronics Co., Ltd., Suwon-si (KR)

(72) Inventor: Sun Ki Min, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 514 days.

(21) Appl. No.: 17/456,474

(22) Filed: Nov. 24, 2021

(65) Prior Publication Data

US 2022/0310811 A1  Sep. 29, 2022

(30) Foreign Application Priority Data

Mar. 23, 2021  (KR) .................. 10-2021-0037039

(51) Int. Cl.
*H01L 29/417* (2006.01)
*H01L 27/06* (2006.01)
*H01L 27/088* (2006.01)

(52) U.S. Cl.
CPC .... *H01L 29/41791* (2013.01); *H01L 27/0688* (2013.01); *H01L 27/0886* (2013.01)

(58) Field of Classification Search
CPC .......... H01L 29/41791; H01L 29/0673; H01L 29/0847; H01L 29/41725; H01L 29/66439; H01L 29/1079; H01L 27/0688; H01L 27/0886; H01L 27/088; H01L 2029/7858; H01L 21/76834; H01L 21/76832; H01L 21/823431
See application file for complete search history.

(56) References Cited

U.S. PATENT DOCUMENTS

| | | | |
|---|---|---|---|
| 6,730,573 B1 | 5/2004 | Ng et al. | |
| 8,951,907 B2 | 2/2015 | Richter et al. | |
| 9,443,769 B2 | 9/2016 | Wang et al. | |
| 9,589,836 B1 | 3/2017 | Zhang et al. | |
| 10,515,907 B2 | 12/2019 | Fujita et al. | |
| 2006/0170020 A1 | 8/2006 | Ohta et al. | |
| 2007/0148953 A1 | 6/2007 | Itani et al. | |
| 2008/0079090 A1* | 4/2008 | Hwang | H01L 21/76889 257/E21.409 |
| 2011/0263113 A1 | 10/2011 | Matsubara et al. | |
| 2016/0111325 A1* | 4/2016 | JangJian | H01L 23/53295 257/774 |
| 2018/0096934 A1* | 4/2018 | Siew | H01L 29/41791 |
| 2018/0294219 A1* | 10/2018 | Kim | H01L 21/76816 |
| 2019/0229062 A1* | 7/2019 | Shin | H01L 21/76829 |

(Continued)

*Primary Examiner* — Fernando L Toledo
*Assistant Examiner* — Marshall Mu-Nuo Hatfield
(74) *Attorney, Agent, or Firm* — Myers Bigel, P.A.

(57) ABSTRACT

A semiconductor includes a gate structure on a substrate and including a gate electrode, a source/drain pattern on a side surface of the gate electrode, a source/drain contact connected to the source/drain pattern, a first etching stop film structure on the source/drain contact and the gate structure, the first etching stop film structure including a first lower etching stop film and a silicon nitride film on the first lower etching stop film, and a first via plug inside the first etching stop film structure and connected to the source/drain contact, wherein the first lower etching stop film includes aluminum, and wherein an upper surface of the silicon nitride film is on a same plane as an upper surface of the first via plug.

19 Claims, 39 Drawing Sheets

(56) References Cited

U.S. PATENT DOCUMENTS

| | | |
|---|---|---|
| 2020/0006230 A1 | 1/2020 | Tsai et al. |
| 2020/0027875 A1* | 1/2020 | Hong ............... H01L 21/823828 |
| 2020/0091146 A1* | 3/2020 | Tsao ..................... H01L 23/535 |
| 2020/0105936 A1* | 4/2020 | More ................ H01L 29/41791 |
| 2020/0212189 A1* | 7/2020 | Tan ................... H01L 21/76834 |
| 2021/0098365 A1* | 4/2021 | Chou ................ H01L 21/76802 |
| 2022/0093757 A1* | 3/2022 | Huang ................ H01L 29/4236 |
| 2022/0223517 A1* | 7/2022 | Wang ............... H01L 21/32115 |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2021-0037039 filed on Mar. 23, 2021 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a semiconductor device and a method for fabricating the same.

2. Description of the Related Art

A multi gate transistor in which a multi-channel active pattern (or a silicon body) having a fin or nanowire shape is formed on a substrate and a gate is formed on a surface of the multi-channel active pattern has been proposed as one of the scaling technologies for increasing the density of semiconductor devices.

Because such a multi-gate transistor uses a three-dimensional channel, scaling may be more readily performed. Further, even if a gate length of the multi-gate transistor is not increased, the current control capability may be improved. Furthermore, a SCE (short channel effect) in which the potential of a channel region is influenced by the drain voltage may be effectively suppressed.

As a pitch size of a semiconductor device decreases, however, there may be a need for research to secure a decrease in capacitance and electrical stability between contacts in the semiconductor device.

SUMMARY

Aspects of the present disclosure provide a semiconductor device capable of improving element performance and reliability.

Aspects of the present disclosure also provide a method for fabricating a semiconductor device capable of improving element performance and reliability.

According to some aspects of the present inventive concept, there is provided a semiconductor device comprising a gate structure on a substrate and including a gate electrode, a source/drain pattern on a side surface of the gate electrode, a source/drain contact connected to the source/drain pattern, a first etching stop film structure on the source/drain contact and the gate structure, the first etching stop film structure including a first lower etching stop film and a silicon nitride film on the first lower etching stop film, and a first via plug inside the first etching stop film structure and connected to the source/drain contact, wherein the first lower etching stop film includes aluminum, and wherein an upper surface of the silicon nitride film is on a same plane as an upper surface of the first via plug.

According to some aspects of the present inventive concept, there is provided a semiconductor device comprising a gate structure on a substrate and including a gate electrode, a source/drain pattern on a side surface of the gate electrode, a source/drain contact connected to the source/drain pattern, a gate contact connected to the gate electrode, a first etching stop film structure on the source/drain contact and the gate contact, the first etching stop film structure including a silicon nitride film, a first via plug inside the first etching stop film structure and connected to the source/drain contact, a second via plug inside the first etching stop film structure and connected to the gate contact, and a wiring line that extends along an upper surface of the silicon nitride film, is in physical contact with the upper surface of the silicon nitride film, and is connected to the first via plug, wherein the first via plug includes a first width expansion region, and an upper region directly connected to the first width expansion region, wherein a width of the first width expansion region increases and then decreases with increasing distance from the substrate, and wherein a boundary between the first width expansion region and the upper region is higher than a lower surface of the first etching stop film structure in a cross-sectional view of the semiconductor device where the substrate provides a base reference plane.

According to some aspects of the present inventive concept, there is provided a semiconductor device comprising a multi-channel active pattern on a substrate, a gate structure on the multi-channel active pattern and including a gate electrode and a gate capping pattern on the gate electrode, a source/drain pattern placed on a side surface of the gate structure, a source/drain contact connected to the source/drain pattern, a gate contact connected to the gate electrode, a first etching stop film structure on the source/drain contact and on the gate contact, the first etching stop film structure including a silicon nitride film, a first via plug inside the first etching stop film structure and connected to the source/drain contact, a second via plug in the first etching stop film structure and connected to the gate contact, a second etching stop film structure that is in physical contact with the first etching stop film structure, an interlayer insulating film on the second etching stop film structure and a wiring line inside the second etching stop film structure and the interlayer insulating film and connected to the first via plug, wherein the second etching stop film structure includes a second lower etching stop film that includes aluminum and is in physical contact with the silicon nitride film, and wherein a height of the first via plug and a height of the second via plug are each less than a height of the gate contact in a cross-sectional view of the semiconductor device where the substrate provides a base reference plane.

According to some aspects of the present inventive concept, there is provided a method for fabricating a semiconductor device, the method comprising forming a source/drain contact and a gate contact on a substrate, forming a first etching stop film structure on the source/drain contact and on the gate contact, the first etching stop film structure including a first lower etching stop film and a silicon nitride film on the first lower etching stop film, forming a first via hole in the first etching stop film structure that exposes the gate contact, forming a second via hole in the first etching stop film structure that exposes the source/drain contact, forming a first via plug and a second via plug in the first via hole and the second via hole, respectively, forming a second etching stop film structure that extends along an upper surface of the first etching stop film structure, an upper surface of the first via plug, and an upper surface of the second via plug, and includes a plurality of films, forming an interlayer insulating film on the second etching stop film structure, and forming a wiring line that penetrates the interlayer insulating film and the second etching stop film structure and is connected to the first via plug and the second via plug, wherein the first lower etching stop film and the second etching stop film structure each include aluminum, and wherein an upper surface of the silicon nitride film is on a same plane as the upper surface of the first via plug and the upper surface of the second via plug.

However, aspects of the present disclosure are not restricted to the ones set forth herein. The above and other aspects of the present disclosure will become more apparent to one of ordinary skill in the art to which the present disclosure pertains by referencing the detailed description of embodiments of the inventive concept given below.

DETAILED DESCRIPTION OF THE EMBODIMENTS

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. Hereinafter, example embodiments of the present inventive concept will be described with reference to the accompanying drawings.

Although a semiconductor device is illustrated herein as a fin type transistor (FinFET) including a channel region of a fin type pattern shape, a transistor including a nanowire or a nanosheet, a MBCFET™ (Multi-Bridge Channel Field Effect Transistor) or a vertical transistor (Vertical FET), the embodiments of the inventive concept are not limited thereto. A semiconductor device according to some embodiments may include a tunneling transistor (tunneling FET) or a three-dimensional (3D) transistor. A semiconductor device according to some embodiments may include a planar transistor. In addition, embodiments of the inventive concept may be applied to transistors based on two-dimensional materials (2D material based FETs) and a heterostructure thereof.

Further, a semiconductor device according to some embodiments may also include a bipolar junction transistor, a laterally diffused metal oxide semiconductor (LDMOS), or the like.

A semiconductor device according to some embodiments will be described referring to FIGS. 1 to 5C.

Figure 1:
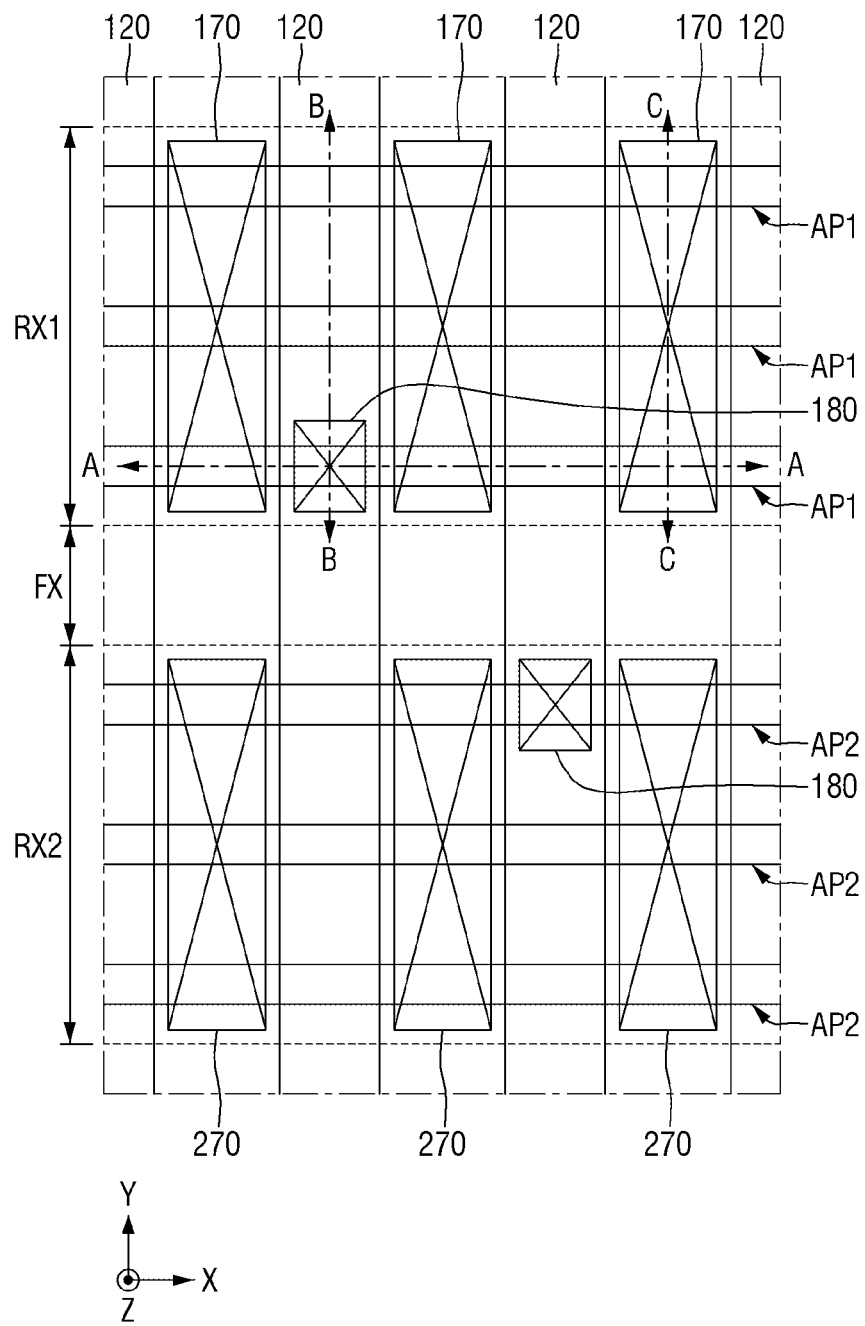
FIG. 1 is an example layout diagram for illustrating a semiconductor device according to some embodiments.
Figure 2:
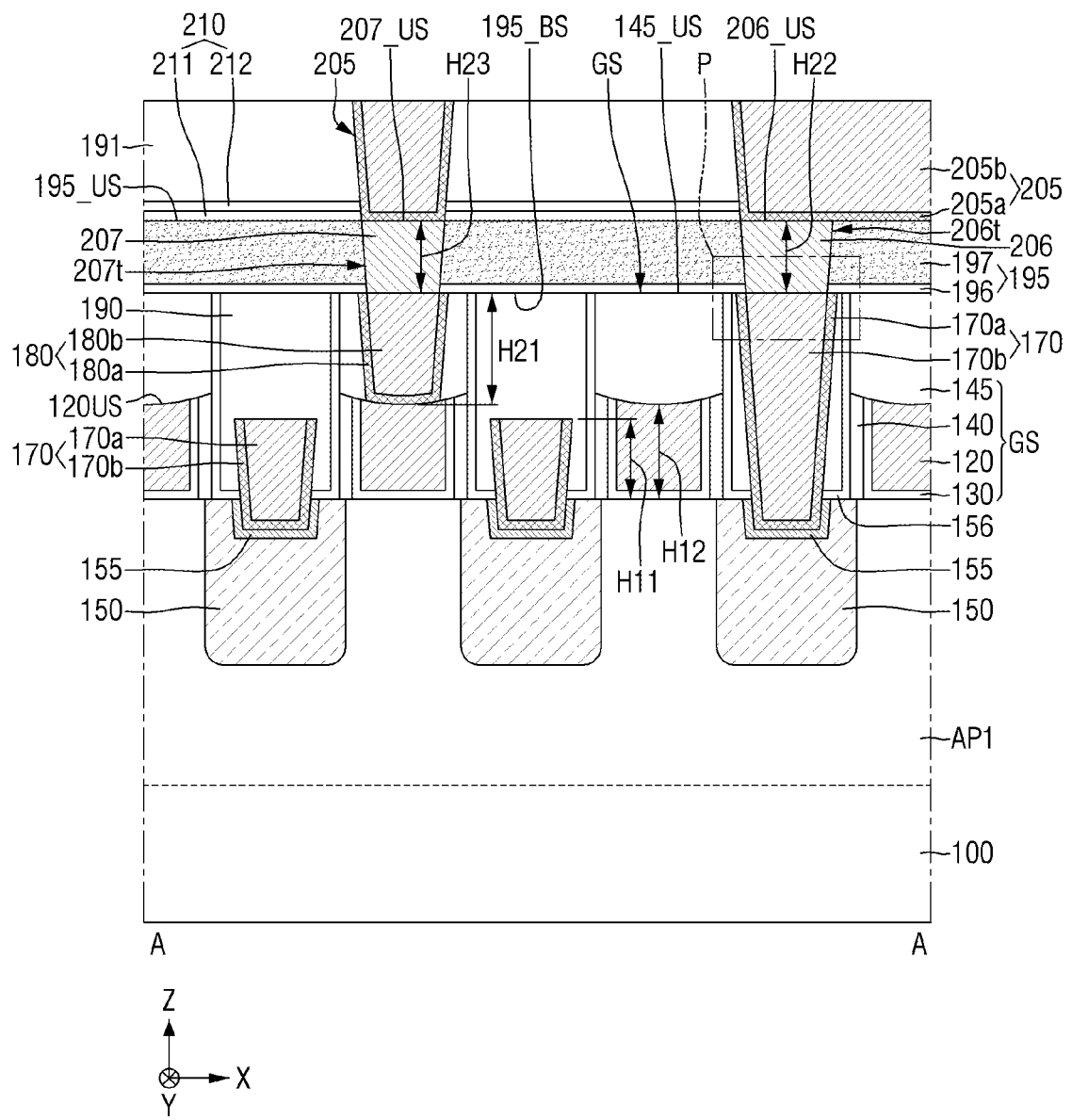
FIGS. 2 to 4 are example cross-sectional views taken along lines A-A, B-B, and C-C of FIG. 1.
Figure 3:
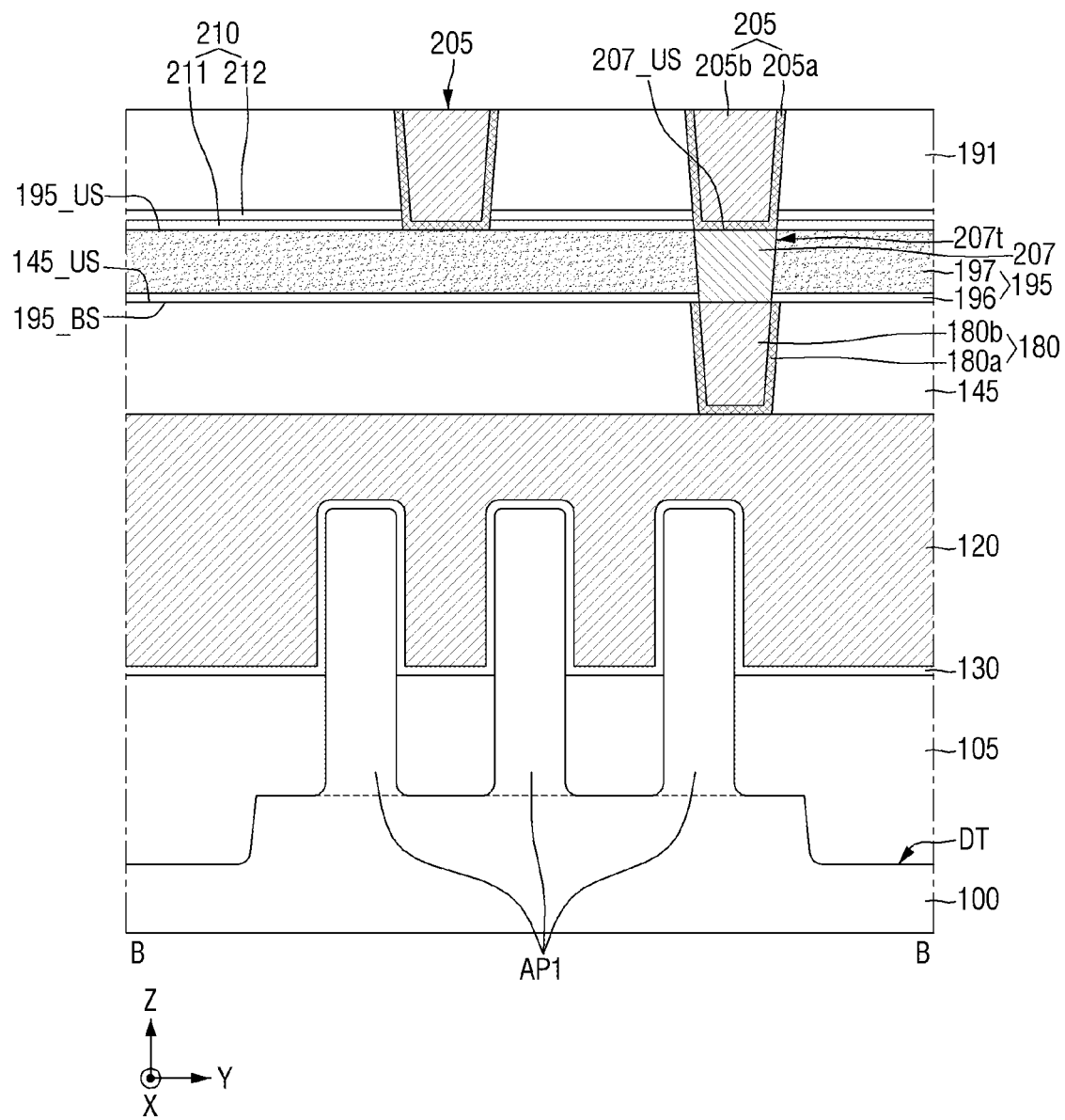
Figure 4:
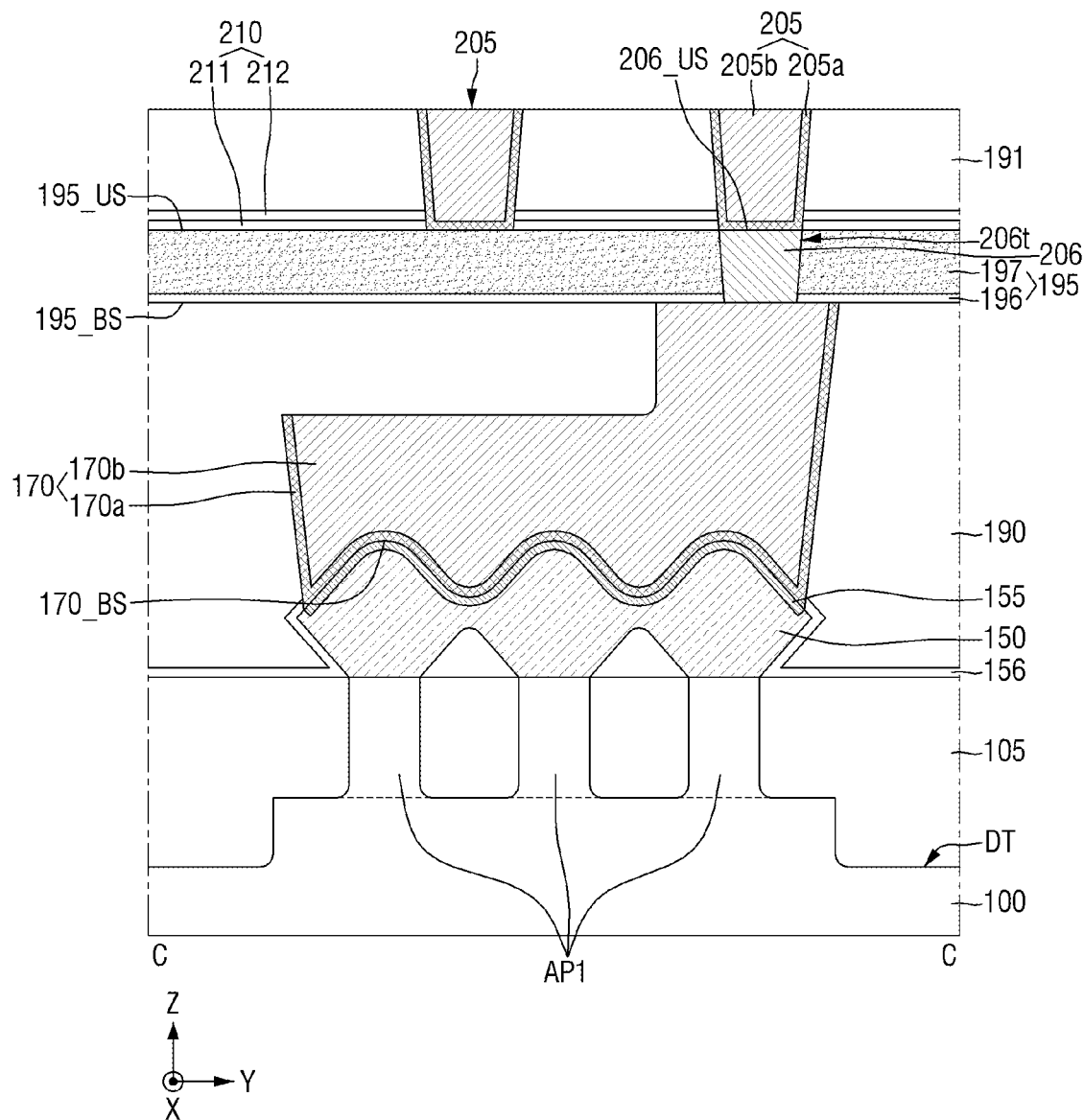
Figure 5A:
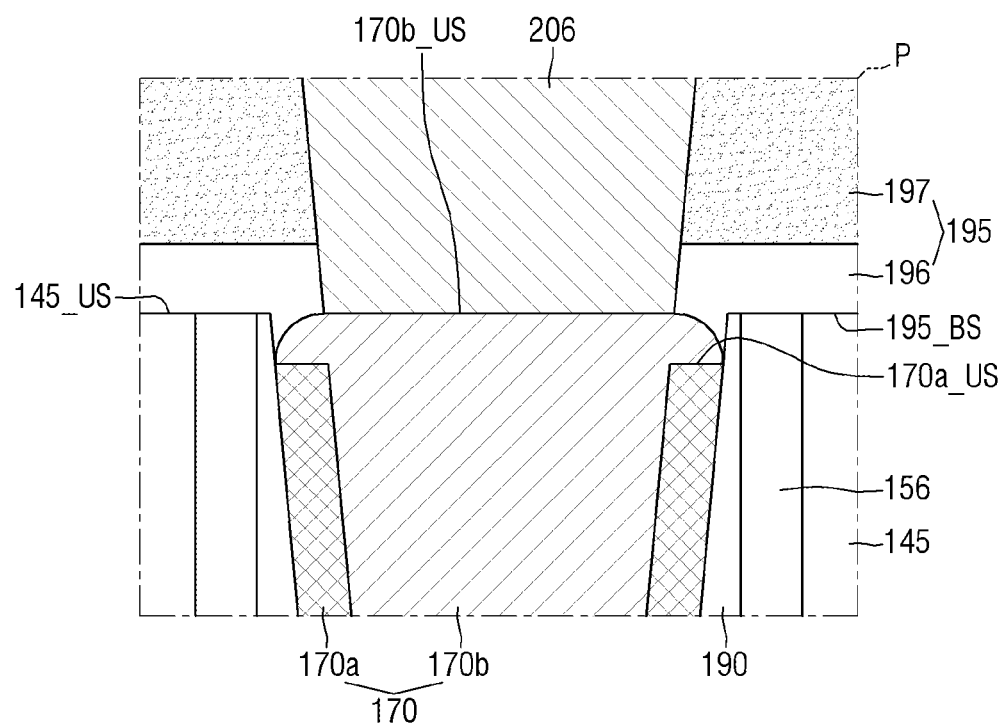
FIGS. 5A to 5C are enlarged views of a portion P of FIG. 2.
Figure 5B:
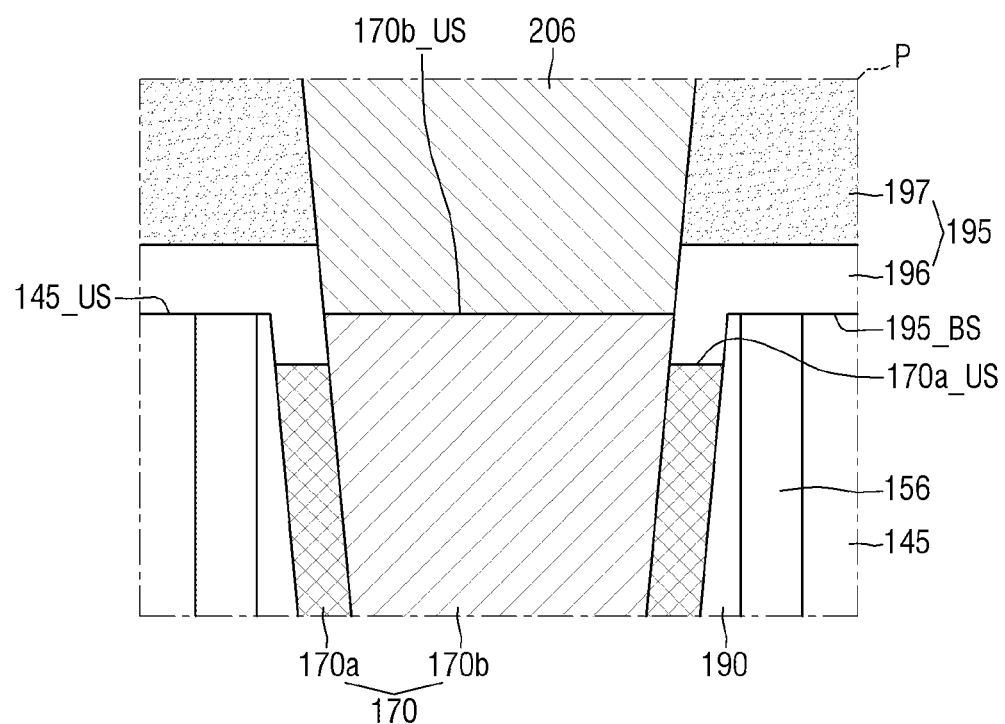
Figure 5C:
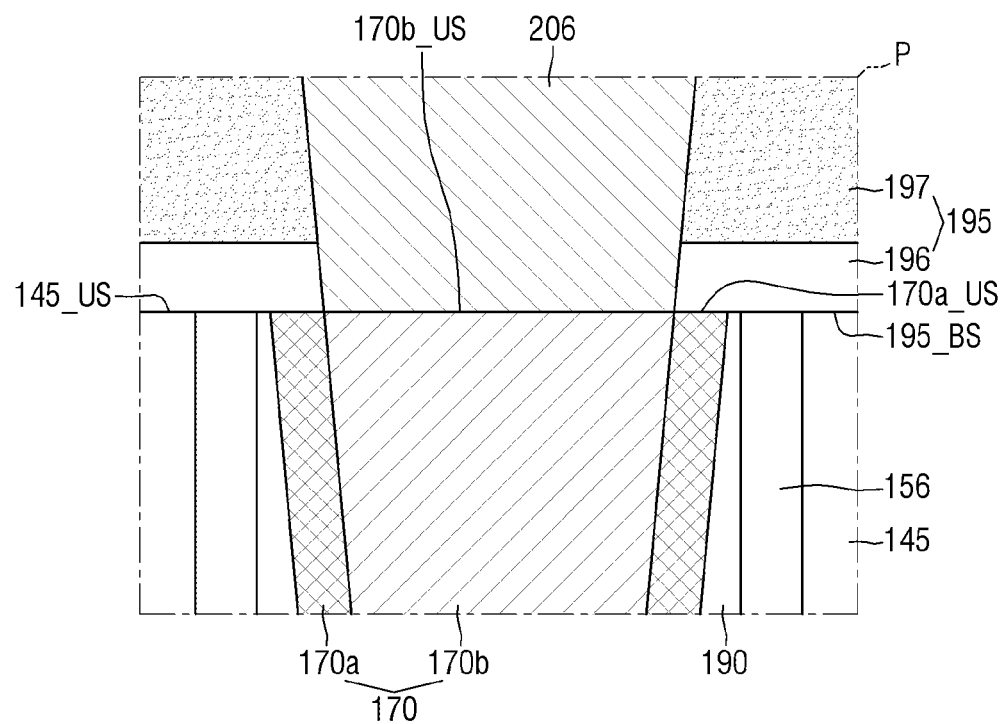

FIG. 1 is an example layout diagram that illustrates a semiconductor device according to some embodiments. FIGS. 2 to 4 are example cross-sectional views taken along lines A-A, B-B, and C-C of FIG. 1. FIGS. 5A to 5C are enlarged views of a portion P of FIG. 2. For convenience of description, FIG. 1 does not show a first via plug 206, a second via plug 207 and a wiring line 205.

For reference, the first via plug 206 and the second via plug 207 are shown as being placed on a single first active pattern AP1 to be adjacent to each other in a first direction X. However, such an arrangement of the first via plug 206 and the second via plug 207 is an example and embodiments of the inventive concept are not limited thereto. Further, a boundary portion between the first gate contact 180 and the second via plug 207 is not shown, but may be similar to those of FIGS. 5A to 5C.

Referring to FIGS. 1 to 5C, a semiconductor device according to some embodiments may include one or more first active patterns AP1, one or more second active patterns AP2, one or more first gate electrodes 120, a first source/drain contact 170, a second source/drain contact 270, a first gate contact 180, a first via plug 206, a second via plug 207, and a wiring line 205.

The substrate 100 may include a first active region RX1, a second active region RX2, and a field region FX. The field region FX may be formed immediately adjacent to the first active region RX1 and the second active region RX2. The field region FX may form a boundary between the first active region RX1 and the second active region RX2.

The first active region RX1 and the second active region RX2 are spaced apart from each other. The first active region RX1 and the second active region RX2 may be separated by the field region FX.

In other words, an element isolation film may be placed around the first active region RX1 and the second active region RX2, which are spaced apart from each other. At this time, a portion of the element isolation film between the first active region RX1 and the second active region RX2 may be the field region FX. For example, a portion, in which the channel region of a transistor, which may be an example of the semiconductor device is formed, may be the active region, and a portion that divides the channel region of the transistor formed in the active region may be the field region. In other embodiments, the active region is a portion in which a fin type pattern or nanosheet used as the channel region of the transistor is formed, and the field region may be a region in which the fin type pattern or nanosheet used as the channel region is not formed.

As shown in FIGS. 3 and 4, the field region FX may be defined by, but is not limited to, a deep trench DT.

As an example, one of the first active region RX1 and the second active region RX2 may be a PMOS formation region, and the other one may be an NMOS formation region. As another example, the first active region RX1 and the second active region RX2 may be the PMOS formation region. As still another example, the first active region RX1 and the second active region RX2 may be the NMOS formation region.

The substrate 100 may be a silicon substrate or an SOI (silicon-on-insulator). In other embodiments, the substrate 100 may include, but is not limited to, silicon germanium, SGOI (silicon germanium on insulator), indium antimonide, lead tellurium compounds, indium arsenic, indium phosphide, gallium arsenide or gallium antimonide.

One or more first active patterns AP1 may be formed in the first active region RX1. The first active pattern AP1 may protrude from the substrate 100 of the first active region RX1. The first active pattern AP1 may extend long along the first direction X on the substrate 100. For example, the first active pattern AP1 may include a long side extending in the first direction X, and a short side extending in a second direction Y. The first direction X may intersect the second direction Y and a third direction Z. Also, the second direction Y may intersect the third direction Z. The third direction Z may be a thickness direction of the substrate 100.

One or more second active patterns AP2 may be formed in the second active region RX2. Description of the second active pattern AP2 may be substantially the same as the description of the first active pattern AP1.

The first active pattern AP1 and the second active pattern AP2 may each be a multi-channel active pattern. In the semiconductor device according to some embodiments, each of the first active pattern AP1 and the second active pattern AP2 may be, for example, a fin type pattern. The first active pattern AP1 and the second active pattern AP2 may be used as the channel region of the transistor, respectively. Although three first active patterns AP1 and three second active patterns AP2 are shown, this is only for convenience of description, and embodiments of the inventive concept are not limited thereto. Each of one or more first active patterns AP1 and second active patterns AP2 may be provided.

Each of the first active pattern AP1 and the second active pattern AP2 may be a part of the substrate 100, and may include an epitaxial layer that is grown from the substrate 100. The first active pattern AP1 and the second active pattern AP2 may include, for example, silicon or germanium, which is an elemental semiconductor material. Further, the first active pattern AP1 and the second active pattern AP2 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound obtained by doping these elements with a group IV element.

The group III-V compound semiconductor may be, for example, one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

As an example, the first active pattern AP1 and the second active pattern AP2 may include the same material. For example, each of the first active pattern AP1 and the second active pattern AP2 may be a silicon fin type pattern. In other embodiments, each of the first active pattern AP1 and the second active pattern AP2 may be a fin type pattern including a silicon-germanium pattern. As another example, the first active pattern AP1 and the second active pattern AP2 may include materials different from each other. For example, the first active pattern AP1 may be a silicon fin type pattern, and the second active pattern AP2 may be a fin type pattern including a silicon-germanium pattern.

The field insulating film 105 may be formed on the substrate 100. The field insulating film 105 may be formed over the first active region RX1, the second active region RX2, and the field region FX. The field insulating film 105 may at least partially fill the deep trench DT.

The field insulating film 105 may be formed on a part of a side wall of the first active pattern AP1 and a part of a side wall of the second active pattern AP2. Each of the first active pattern AP1 and the second active pattern AP2 may protrude upward from the upper surface of the field insulating film 105. The field insulating film 105 may include, for example, an oxide film, a nitride film, an oxynitride film or a combination film thereof.

One or more gate structures GS may be formed on the substrate 100. For example, one or more gate structures GS may be formed on the field insulating film 105. The gate structure GS may extend in the second direction Y. Adjacent gate structures GS may be spaced apart from each other in the first direction X.

The gate structure GS may be formed on the first active pattern AP1 and the second active pattern AP2. The gate structure GS may intersect the first active pattern AP1 and the second active pattern AP2.

Although the gate structure GS is shown as being formed over the first active region RX1 and the second active region RX2, this is only for convenience of description, and the embodiment of the inventive concept are not limited thereto. That is, a part of the gate structure GS is separated into two parts by a gate separation structure on the field insulating film 105, and may be formed on the first active region RX1 and the second active region RX2.

The gate structure GS may include, for example, a first gate electrode 120, a first gate insulating film 130, a first gate spacer 140, and a first gate capping pattern 145.

The first gate electrode 120 may be formed on the first active pattern AP1 and the second active pattern AP2. The first gate electrode 120 may intersect the first active pattern AP1 and the second active pattern AP2. The first gate electrode 120 may wrap the first active pattern AP1 and the second active pattern AP2 protruding from the upper surface of the field insulating film 105. The first gate electrode 120 may include a long side extending in the second direction Y, and a short side extending in the first direction X.

An upper surface 120US of the first gate electrode may be, but is not limited to, a concave curved surface that is recessed toward the upper surface of the first active pattern AP1. That is, unlike the shown configuration, the upper surface 120US of the first gate electrode may also be a flat surface.

The first gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

The first gate electrode 120 may each include conductive metal oxides, conductive metal oxynitrides and the like, and may also include oxidized forms of the aforementioned materials.

The first gate spacer 140 may be formed on the side wall of the first gate electrode 120. The first gate spacer 140 may extend in the second direction Y. The first gate spacer 140 may include, for example, at least one of silicon nitride (SiN), silicon oxynitride (SiON), silicon oxide (Sift), silicon oxycarbonitride (SiOCN), silicon boronitride (SiBN), silicon oxyboronitride (SiOBN), silicon oxycarbide (SiOC), and combinations thereof.

The first gate insulating film 130 may extend along a side wall and a bottom surface of the first gate electrode 120. The first gate insulating film 130 may be formed on the first active pattern AP1, the second active pattern AP2 and the field insulating film 105. The first gate insulating film 130 may be formed between the first gate electrode 120 and the first gate spacer 140.

The first gate insulating film 130 may be formed along a profile of the first active pattern AP1 protruding above the field insulating film 105, and the upper surface of the field insulating film 105. Although not shown, an interface film may be further formed along the profile of the first active pattern AP1 protruding above the field insulating film 105. The first gate insulating film 130 may be formed on the interface film. Although not shown, the first gate insulating film 130 may be formed along a profile of the second active pattern AP2 protruding above the field insulating film 105.

The first gate insulating film 130 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some embodiments may include a NC (Negative Capacitance) FET that uses a negative capacitor. For example, the first gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitance decreases from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. As an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The type of dopant included in the ferroelectric material film may vary depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, a silicon oxide and/or a metal oxide having a high dielectric constant. The metal oxide included in the paraelectric material film may include, for example, but is not limited to, at least one of hafnium oxide, zirconium oxide, and/or aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having ferroelectric properties. A thickness of the ferroelectric material film may be, for example, but is not limited to, 0.5 to 10 nm. Because a critical thickness that exhibits the ferroelectric properties may vary for each ferroelectric material, the thickness of the ferroelectric material film may vary depending on the ferroelectric material.

As an example, the first gate insulating film 130 may include one ferroelectric material film. As another example, the first gate insulating film 130 may include a plurality of ferroelectric material films spaced apart from each other. The first gate insulating film 130 may have a stacked film structure in which the plurality of ferroelectric material films and the plurality of paraelectric material films are alternately stacked.

The first gate capping pattern 145 may be formed on the upper surface 120US of the first gate electrode and the upper surface of the first gate spacer 140. The first gate capping pattern 145 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

Unlike the shown configuration, the first gate capping pattern 145 may be placed between the first gate spacers 140. In such a case, an upper surface 145_US of the first gate capping pattern may be on the same plane as the upper surface of the first gate spacer 140. The upper surface 145_US of the first gate capping pattern may be the upper surface of the gate structure GS.

A first source/drain pattern 150 may be formed on the first active pattern AP1. The first source/drain pattern 150 may be on the substrate 100. The first source/drain pattern 150 may be on the side surface of the gate structure GS. The first source/drain pattern 150 may be between the gate structures GS.

For example, the first source/drain pattern 150 may be on either side of the gate structure GS. Unlike the shown configuration, the first source/drain pattern 150 may be on one side of the gate structure GS and may not be on the other side of the gate structure GS.

The first source/drain pattern 150 may include an epitaxial pattern. The first source/drain pattern 150 may be included in a source/drain of a transistor that uses the first active pattern AP1 as a channel region.

The first source/drain pattern 150 may be connected to a channel pattern portion used as the channel in the first active pattern AP1. Although the first source/drain pattern 150 is shown as a merged form of three epitaxial patterns formed on each first active pattern AP1, this is only for convenience of explanation, and embodiments of the inventive concept are not limited thereto. That is, the epitaxial patterns formed on each of the first active patterns AP1 may be spaced apart from each other.

As an example, an air gap may be placed in a space between the field insulating films 105 merged with the first source/drain pattern 150. As another example, an insulating material may at least partially fill the space between the first source/drain patterns 150 merged with the field insulating film 105.

Although not shown, a source/drain pattern as described above may be formed on the second active pattern AP2 between the gate structures GS.

A source/drain etching stop film 156 may be formed on the upper surface of the field insulating film 105, the side wall of the gate structure GS, the upper surface of the first source/drain pattern 150, and the side wall of the first source/drain pattern 150. The source/drain etching stop film 156 may include a material having an etching selectivity with respect to a first interlayer insulating film 190 to be described below. The source/drain etching stop film 156 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof. Unlike the shown configuration, the lower etching stop film 156 may not be formed.

The first interlayer insulating film 190 may be formed on the field insulating film 105. The first interlayer insulating film 190 may be formed on the first source/drain pattern 150.

The first interlayer insulating film 190 may not cover the upper surface of the first gate capping pattern 145_US. For example, the upper surface of the first interlayer insulating film 190 may be on the same plane as the upper surface 145_US of the first gate capping pattern.

The first interlayer insulating film 190 may include, for example, at least one of silicon oxide, silicon nitride, silicon oxynitride, and/or a low dielectric constant material. The low dielectric constant material may include, but is not limited to, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first source/drain contact 170 may be formed on the first active region RX1. The second source/drain contact 270 may be formed on the second active region RX2. The first source/drain contact 170 may be connected to the first source/drain pattern 150 formed in the first active region RX1. Although not shown, the second source/drain contact 270 may be connected to a source/drain pattern formed in the second active region RX2.

Unlike the shown configuration, a part of the first source/drain contact 170 may be directly connected to a part of the second source/drain contact 270. That is, in a semiconductor device according to some embodiments, one or more source/drain contacts may be placed over the first active region RX1 and the second active region RX2.

Because the second source/drain contact 270 is substantially the same as the first source/drain contact 170, the following description will be provided using the first source/drain contact 170 on the first active pattern AP1 as an example. Such description, however, is also applicable to the source/drain contact 270.

The first gate contact 180 may be inside the gate structure GS, and may be connected to the first gate electrode 120 included in the gate structure GS.

The first gate contact 180 may be at a position where it overlaps the gate structure GS in the third direction Z. In the semiconductor device according to some embodiments, at least a part of the first gate contact 180 may be at a position where it overlaps at least one of the first active region RX1 and the second active region RX2 in the third direction Z.

For example, from a planar viewpoint, the first gate contact 180 may be placed at a position where it entirely overlaps the first active region RX1 or the second active region RX2 in the third direction Z.

The first source/drain contact 170 may pass through the source/drain etching stop film 156 and be connected to the first source/drain pattern 150. The first source/drain contact 170 may be on the first source/drain pattern 150.

The first source/drain contact 170 may be inside the first interlayer insulating film 190. The first source/drain contact 170 may be at least partially surrounded by the first interlayer insulating film 190 in a plan view.

Although the first source/drain contact 170 is shown as not being in physical contact with the gate structures GS located on either side, this is only for convenience of explanation, and embodiments of the inventive concept are not limited thereto. Unlike the shown configuration, the first source/drain contact 170 may be in physical contact with at least one of the gate structures GS located on either side.

A silicide film 155 may be formed between the first source/drain contact 170 and the first source/drain pattern 150. Although the silicide film 155 is shown as being formed along a profile of an interface between the first source/drain pattern 150 and the first source/drain contact 170, embodiments of the inventive concept are not limited thereto. The silicide film 155 may include, for example, a metal silicide material.

The first source/drain contact 170 may include a first portion and a second portion. The first portion of the first source/drain contact 170 may be directly connected to the second portion of the first source/drain contact 170.

The second portion of the first source/drain contact 170 is a portion on which the first via plug 206 is connected or contacted. The first source/drain contact 170 may be connected to the wiring line 205 through the second portion of the first source/drain contact 170. The first portion of the first source/drain contact 170 is not a portion on which the first via plug 206 is connected or contacted.

For example, in a cross-sectional view as shown in FIG. 2, the second portion of the first source/drain contact 170 may be located in the portion connected to the first via plug 206. The first portion of the first source/drain contact 170 may be in a portion that is not connected to the first via plug 206.

Also, to prevent the first gate contact 180 and the first source/drain contact 170 from coming into physical contact with each other, the first portion of the first source/drain contact 170 may be located and the second portion of the first source/drain contact 170 may not be located, on both sides of the gate structure GS of the portion connected to the first gate contact 180. That is, in a cross-sectional view as shown in FIG. 2, the first portion of the first source/drain contact 170 is located, and the second portion of the first source/drain contact 170 may not be located, on both sides of the gate structure GS connected to the first gate contact 180.

The upper surface of the second portion of the first source/drain contact 170 is higher than the upper surface of the first portion of the first source/drain contact 170 in the cross-sectional view of FIG. 4. In FIG. 4, the upper surface of the second portion of the first source/drain contact 170 is higher than the upper surface of the first portion of the first source/drain contact 170, on the basis of the upper surface of the field insulating film 105. For example, the upper surface of the first source/drain contact 170 may be the upper surface of the second portion of the first source/drain contact 170.

In FIG. 4, although the first source/drain contact 170 is shown as having an L-shape, embodiments of the inventive concept are not limited thereto. Unlike the shown configuration, the first source/drain contact 170 may also have a T-shape rotated by 180 degrees. In such an example, the first portion of the first source/drain contact 170 may be located on either side of the second portion of the first source/drain contact 170.

The first interlayer insulating film 190 does not cover the upper surface of the first source/drain contact 170. For example, the first interlayer insulating film 190 may not cover the upper surface of the second portion of the first source/drain contact 170.

As an example, the upper surface of the first source/drain contact 170 may not protrude upward from the upper surface 145_US of the first gate capping pattern. The upper surface of the second portion of the first source/drain contact 170 may be located on the same plane as the upper surface 145_US of the gate structure. As another example, unlike the shown configuration, the upper surface of the first source/drain contact 170 may protrude upward from the upper surface 145_US of the first gate capping pattern.

For example, a height H12 from the upper surface of the first active pattern AP1 to the upper surface 120US of the first gate electrode may be greater than a height H11 from the upper surface of the first active pattern AP1 to the upper surface of the first portion of the first source/drain contact 170. In the cross-sectional view, if the upper surface 120US of the first gate electrode has a concave shape, the height of the upper surface 120US of the gate electrode may be a portion that is closest to the upper surface of the first active pattern AP1.

The first source/drain contact 170 may include a first source/drain barrier film 170a, and a first source/drain filling film 170b on the first source/drain barrier film 170a. The first source/drain barrier film 170a may extend along the side walls and bottom surface of the first source/drain filling film 170b.

Although a bottom surface 170_BS of the first source/drain contact is shown as having a wavy shape, embodiments of the inventive concept are not limited thereto. Unlike the shown configuration, the bottom surface 170_BS of the first source/drain contact may have a flat shape.

In FIGS. 2, 5A, and 5B, an upper surface 170a_US of the first source/drain barrier film may be lower than an upper surface 170b_US of the first source/drain filling film, on the basis of the upper surface of the first active pattern AP1. In FIG. 5A, the first source/drain filling film 170b may cover or overlap at least a part of the upper surface 170a_US of the first source/drain barrier film in the third direction Z. In FIG. 5B, the first source/drain filling film 170b does not cover or overlap the upper surface 170a_US of the first source/drain barrier film in the third direction Z.

In FIGS. 2 and 5C, the upper surface 170a_US of the first source/drain barrier film may be located at substantially the same height as the upper surface 170b_US of the first source/drain filling film, on the basis of the upper surface of the first active pattern AP1. The first source/drain filling film 170b does not cover or overlap the upper surface 170a_US of the first source/drain barrier film in the third direction Z.

The first source/drain barrier film 170a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), and/or a two-dimensional (2D) material. In the semiconductor device according to some embodiments, the two-dimensional material may be a metallic material and/or a semiconductor material. The 2D material may include a 2D allotrope or a 2D compound, and may include, but is not limited to, at least one of graphene, molybdenum disulfide ($MoS_2$), molybdenum diselenide ($MoSe_2$), tungsten diselenide ($WSe_2$), and/or tungsten disulfide ($WS_2$). That is, because the above-mentioned 2D materials are only listed by way of example, the 2D materials that may be included in the semiconductor device, according to some embodiments of the inventive concept, are not limited by the above-mentioned materials.

The first source/drain filling film 170b may include, for example, at least one of aluminum (Al), tungsten (W), cobalt (Co), ruthenium (Ru), silver (Ag), gold (Au), manganese (Mn), and/or molybdenum (Mo).

The first gate contact 180 may be placed on the first gate electrode 120, and may penetrate the first gate capping pattern 145 and be connected to the first gate electrode 120.

As an example, the upper surface of the first gate contact 180 may be on the same plane as the upper surface 145_US of the first gate capping pattern. As another example, unlike the shown configuration, the upper surface of the first gate contact 180 may protrude upward from the upper surface 145_US of the first gate capping pattern.

The first gate contact 180 may include a gate barrier film 180*a*, and a gate filling film 180*b* on the gate barrier film 180*a*. The contents of the materials included in the gate barrier film 180*a* and the gate filling film 180*b* may be the same as the description of the first source/drain barrier film 170*a* and the first source/drain filling film 170*b*.

A first etching stop film structure 195 may be formed on the first interlayer insulating film 190, the gate structure GS, the first source/drain contact 170, and the first gate contact 180. The first etching stop film structure 195 may include a first via hole 206*t* and a second via hole 207*t*. The first via hole 206*t* may expose the first source/drain contact 170. The second via hole 207*t* may expose the first gate contact 180.

The first etching stop film structure 195 may include a first lower etching stop film 196 and a silicon nitride film 197. The silicon nitride film 197 is formed on the first lower etching stop film 196. The first lower etching stop film 196 is positioned below the silicon nitride film 197. The first lower etching stop film 196 is positioned between the silicon nitride film 197 and the first interlayer insulating film 190. For example, the first lower etching stop film 196 may be in physical contact with the silicon nitride film 197.

The first etching stop film structure 195 includes a lower surface 195_BS and an upper surface 195_US opposite to each other in the third direction Z. The lower surface 195_BS of the first etching stop film structure faces the first source/drain contact 170 and the first gate contact 180.

The silicon nitride film 197 includes the upper surface 195_US of the first etching stop film structure. In other words, the upper surface of the silicon nitride film 197 is the upper surface 195_US of the first etching stop film structure.

In the semiconductor device according to some embodiments, the first lower etching stop film 196 includes the lower surface 195_BS of the first etching stop film structure. The lower surface 195_BS of the first etching stop film structure may be defined by the first lower etching stop film 196.

In the semiconductor device according to some embodiments, the first lower etching stop film 196 may be in physical contact with the upper surface of the first interlayer insulating film 190 and the upper surface 145_US of the gate structure.

The first lower etching stop film 196 may include aluminum. The first lower etching stop film 196 may include, for example, at least one of aluminum oxide and/or aluminum nitride. The silicon nitride film 197 includes silicon nitride. The silicon nitride film 197 is formed of silicon nitride.

The first via plug 206 and the second via plug 207 are inside the first etching stop film structure 195. The first via plug 206 passes through the first lower etching stop film 196, and may be connected to the first source/drain contact 170. The second via plug 207 passes through the first lower etching stop film 196, and may be connected to the first gate contact 180. Although not shown, the first via plug 206 may be connected to the second source/drain contact 270.

The first via plug 206 may at least partially fill the first via hole 206*t* inside the first etching stop film structure 195. The second via plug 207 may at least partially fill the second via hole 207*t* inside the first etching stop film structure 195.

In the semiconductor device according to some embodiments, the upper surface 206_US of the first via plug and the upper surface 207_US of the second via plug may be on the same plane as the upper surface 195_US of the first etching stop film structure. In other words, the upper surface 206_US of the first via plug and the upper surface 207_US of the second via plug may be on the same plane as the upper surface of the silicon nitride film 197.

For example, a height H22 of the first via plug 206 is less than a height H21 of the first gate contact 180. A height H23 of the second via plug 207 is less than the height H21 of the first gate contact 180.

Because the heights of the first via plug 206 and the second via plug 207 are less than the height of the first gate contact 180, resistance between the wiring line 205 and the first source/drain contact 170, and resistance between the wiring line 205 and the first gate contact 180 can be reduced. The performance and reliability of the semiconductor device can be improved accordingly.

In the semiconductor device according to some embodiments, the first via plug 206 and the second via plug 207 may each have a single, monolithic film structure. The first via plug 206 and the second via plug 207 may not have a multi-film structure including different materials from each other. The first via plug 206 and the second via plug 207 may each be formed of a single conductive material. That is, the first via plug 206 and the second via plug 207 may each have a single conductive film structure.

The first via plug 206 and the second via plug 207 may include, for example, tungsten (W). The first via plug 206 may have a single film structure made of tungsten. However, the material for forming the first via plug 206 and the second via plug 207 is not limited to tungsten in accordance with various embodiments of the inventive concept.

A second etching stop film structure 210 is formed on the first etching stop film structure 195. The second etching stop film structure 210 may include a plurality of films sequentially stacked on the silicon nitride film 197.

In the semiconductor device according to some embodiments, the second etching stop film structure 210 may include a second lower etching stop film 211 and a second insertion etching stop film 212.

The second insertion etching stop film 212 may be formed on the second lower etching stop film 211. The second insertion etching stop film 212 is positioned between the second lower etching stop film 211 and the silicon nitride film 197.

The second etching stop film structure 210 is in physical contact with the first etching stop film structure 195. The second lower etching stop film 211 is in physical contact with the silicon nitride film 197. The second lower etching stop film 211 is in physical contact with the upper surface of the silicon nitride film 197.

The second lower etching stop film 211 may include aluminum. The second lower etching stop film 211 may include, for example, at least one of aluminum oxide and/or aluminum nitride.

The second insertion etching stop film 212 may include, for example, silicon (Si) and/or carbon (C). The second insertion etching stop film 212 may include, for example, silicon oxycarbide (SiOC).

Unlike the shown configuration, the second insertion etching stop film 212 may be omitted in other embodiments.

The second interlayer insulating film 191 is formed on the second etching stop film structure 210. The second interlayer insulating film 191 may be in physical contact with the second etching stop film structure 210. The second interlayer insulating film 191 may include, for example, at least one of silicon oxide, silicon nitride, silicon oxynitride, and/or a low dielectric constant material.

The wiring line 205 may be inside the second interlayer insulating film 191 and the second etching stop film structure 210.

The wiring line 205 is connected to the first via plug 206. The wiring line 205 may be in physical contact with the first via plug 206. The wiring line 205 is connected to the second via plug 207. The wiring line 205 may be in physical contact with the second via plug 207.

The wiring line 205 penetrates the second etching stop film structure 210, and is in physical contact with the silicon nitride film 197. The wiring line 205 is in physical contact with the upper surface of the silicon nitride film 197. That is, the wiring line 205 is in physical contact with the upper surface 195_US of the first etching stop film structure.

In FIGS. 2 and 4, the wiring line 205 connected to the first via plug 206 may extend in the first direction X. The wiring line 205 connected to the first via plug 206 may extend in the first direction X along the upper surface of the silicon nitride film 197.

The wiring line 205 may include a wiring barrier film 205a and a wiring filling film 205b. The wiring barrier film 205a may extend along the upper surface 191 US of the second interlayer insulating film, the upper surface 206_US of the first via plug, and the upper surface 207_US of the second via plug. The wiring filling film 205b may be formed on the wiring barrier film 205a.

The wiring barrier film 205a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh) and a two-dimensional (2D) material. The wiring filling film 205b may include, for example, at least one of aluminum (Al), copper (Cu), tungsten (W), cobalt (Co), ruthenium (Ru), silver (Ag), gold (Au), manganese (Mn), and/or molybdenum (Mo).

Figure 6:
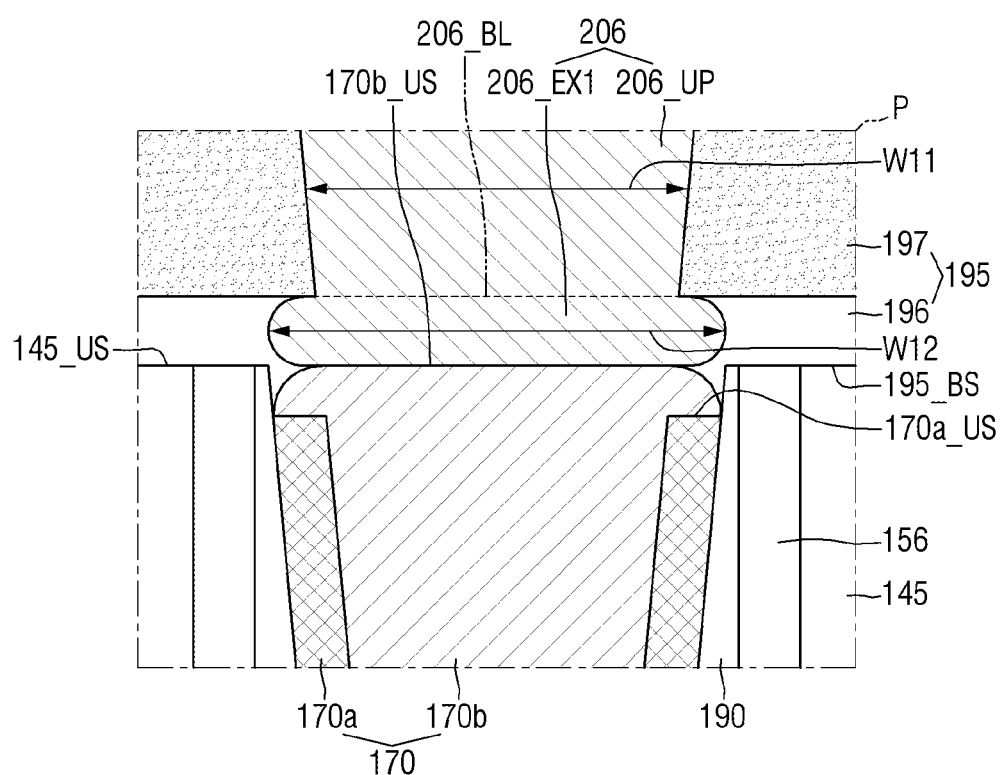
FIGS. 6 to 8 are diagrams that illustrate a semiconductor device according to some embodiments.
Figure 7:
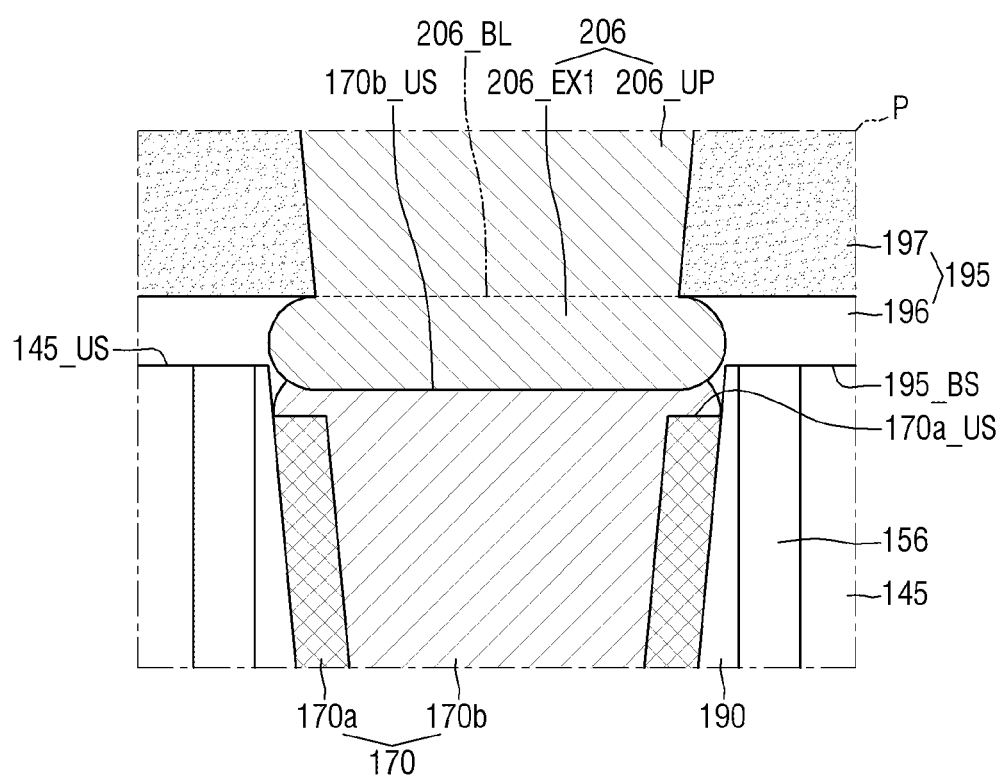
Figure 8:
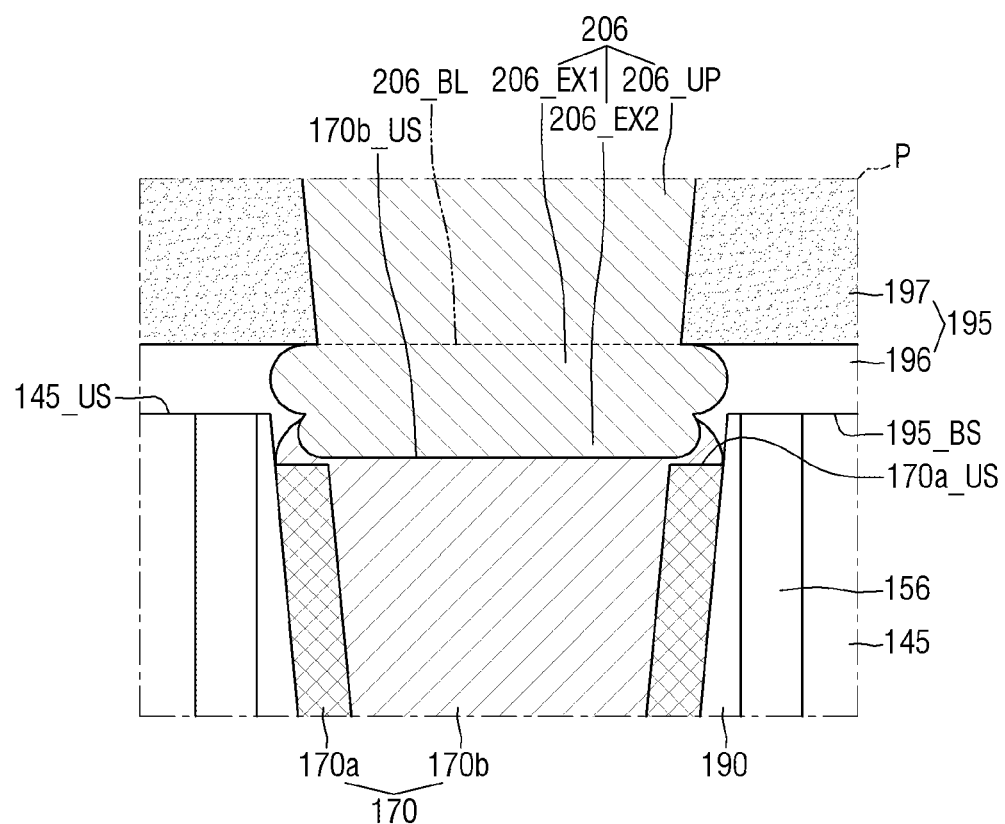

FIGS. 6 to 8 are diagrams that illustrate a semiconductor device according to some embodiments. For convenience of description, features different from those described using FIGS. 1 to 5C will be mainly described.

For reference, FIGS. 6 to 8 are enlarged views of a portion P of FIG. 2. Further, although FIGS. 6 to 8 are shown on the basis of FIG. 5A, embodiments of the inventive concept are not limited thereto. That is, embodiments including configurations and placements of various elements shown in FIGS. 6 to 8 may appear in FIGS. 5B and 5C.

Referring to FIGS. 6 to 8, in the semiconductor device according to some embodiments, the first via plug 206 may include one or more width expansion regions 206_EX1 and 206_EX2.

In FIGS. 6 and 7, the first via plug 206 may include a first width expansion region 206_EX1, and an upper region 206_UP on the first width expansion region 206_EX1. The upper region 206_UP is directly connected to the first width expansion region 206_EX1.

The upper region 206_UP may be inside the silicon nitride film 197. At least a part of the first width expansion region 206_EX1 may be inside the first lower etching stop film 196.

For example, the width W11 of the upper region 206_UP in the first direction X may increase with increasing distance from the substrate (100 of FIG. 2). In other embodiments, the width W11 of the upper region 206_UP in the first direction X may be constant with increasing distance from the substrate 100.

The width W12 of the first width expansion region 206_EX1 may increase and then decrease with increasing distance from the substrate 100 in the first direction X.

On the basis of the upper surface of the first active pattern (AP1 of FIG. 2), a boundary 206_BL between the first width expansion region 206_EX1 and the upper region 206_UP is located higher than the lower surface 195_BS of the first etching stop film structure.

In FIG. 6, the first width expansion region 206_EX1 may be inside the first lower etching stop film 196. The lower surface of the first via plug 206 forming a boundary with the first source/drain contact 170 may be at the same height of the upper surface 145_US of the first gate capping pattern, on the basis of the upper surface of the first active pattern (AP1 of FIG. 2).

In FIG. 7, a part of the first width expansion region 206_EX1 may be located inside the first lower etching stop film 196. The lower surface of the first via plug 206 forming the boundary with the first source/drain contact 170 may be lower than the upper surface 145_US of the first gate capping pattern, on the basis of the upper surface of the first active pattern (AP1 of FIG. 2).

In FIG. 8, the first via plug 206 may include a plurality of width expansion regions 206_EX1 and 206_EX2. The first via plug 206 may include a second width expansion region 206_EX2, a first width expansion region 206_EX1, and an upper region 206_UP, which are sequentially formed on the first source/drain contact 170. The first width expansion region 206_EX1 is directly connected to the upper region 206_UP and the first width expansion region 206_EX1.

The width of the first width expansion region 206_EX1 and the width of the second width expansion region 206_EX2 may increase and then decrease with increasing distance from the substrate 100. At least a part of the first width expansion region 206_EX1 is located inside the first lower etching stop film 196. The second width expansion region 206_EX2 is inside the first source/drain contact 170.

Although not shown, the second via plug 207 may include one or more width expansion regions. The description of the second via plug 207 may be substantially the same as the description of the first via plug 206 described above.

FIGS. 9 to 12 are diagrams that illustrate a semiconductor device according to some embodiments. For convenience of explanation, features different from those described using FIGS. 1 to 5C will be mainly described.

Figure 9:
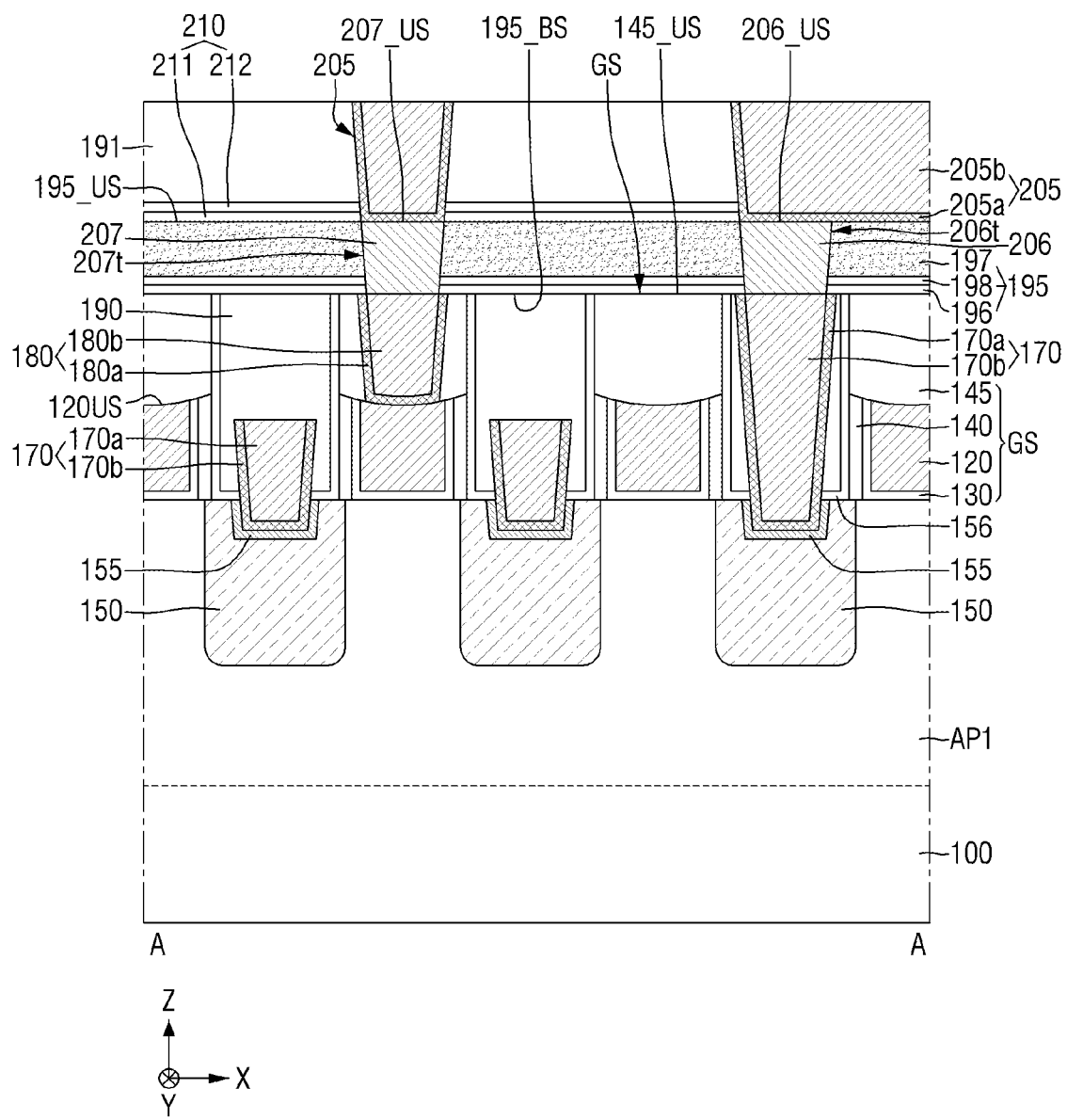
FIGS. 9 to 12 are diagrams that illustrate a semiconductor device according to some embodiments.

Referring to FIG. 9, in the semiconductor device according to some embodiments, the first etching stop film structure 195 may further include a first upper etching stop film 198 located between the first lower etching stop film 196 and the silicon nitride film 197.

The first upper etching stop film 198 may include, for example, silicon (Si) and/or carbon (C). The second insertion etching stop film 212 may include, for example, a silicon oxycarbide (SiOC).

Figure 10:
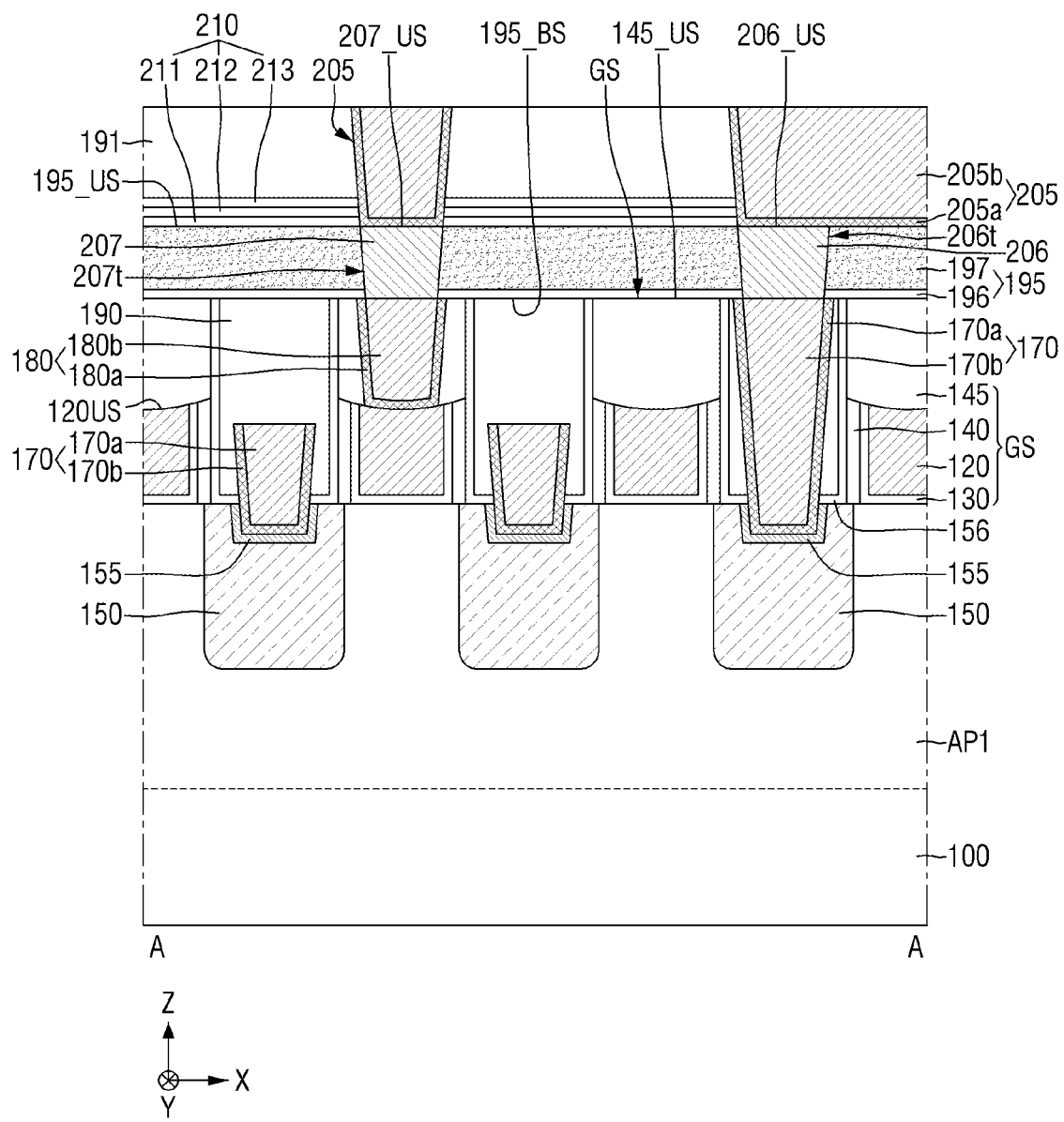

Referring to FIG. 10, in the semiconductor device according to some embodiments, the second etching stop film structure 210 may further include a second upper etching stop film 213 formed on the second insertion etching stop film 212.

The second upper etching stop film 213 is located between the second lower etching stop film 211 and the second interlayer insulating film 191. The second upper etching stop film 213 is spaced apart from the second lower etching stop film 211 in the third direction Z.

The second upper etching stop film 213 may include aluminum. The second upper etching stop film 213 may include, for example, at least one of aluminum oxide and/or aluminum nitride.

As an example, the second lower etching stop film 211 and the second upper etching stop film 213 may include the same material. For example, the second lower etching stop film 211 and the second upper etching stop film 213 may each include aluminum oxides. As another example, the second lower etching stop film 211 and the second upper etching stop film 213 may include different materials from each other. For example, the second lower etching stop film 211 may include aluminum nitride, and the second upper etching stop film 213 may include aluminum oxide.

Unlike the aforementioned configuration, the second lower etching stop film 211 and the second upper etching stop film 213 may each include aluminum nitride. In other embodiments, the second lower etching stop film 211 may include aluminum oxide, and the second upper etching stop film 213 may include aluminum nitride.

Figure 11:
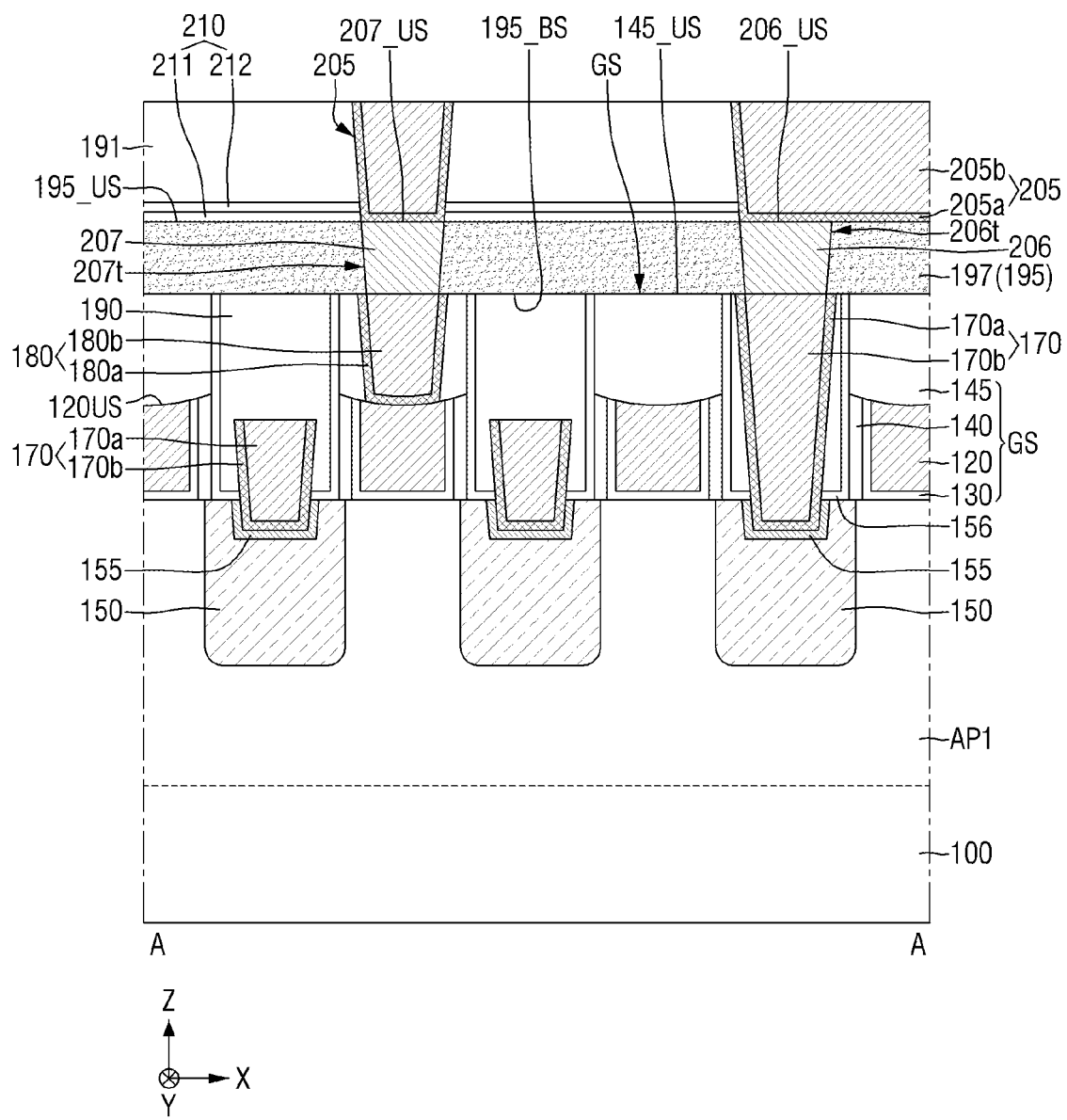

Referring to FIG. 11, in a semiconductor device according to some embodiments, the first etching stop film structure 195 may be made up of silicon nitride film 197.

The upper surface 195_US of the first etching stop film structure and the lower surface 195_BS of the first etching stop film structure each may be defined by the silicon nitride film 197.

Figure 12:
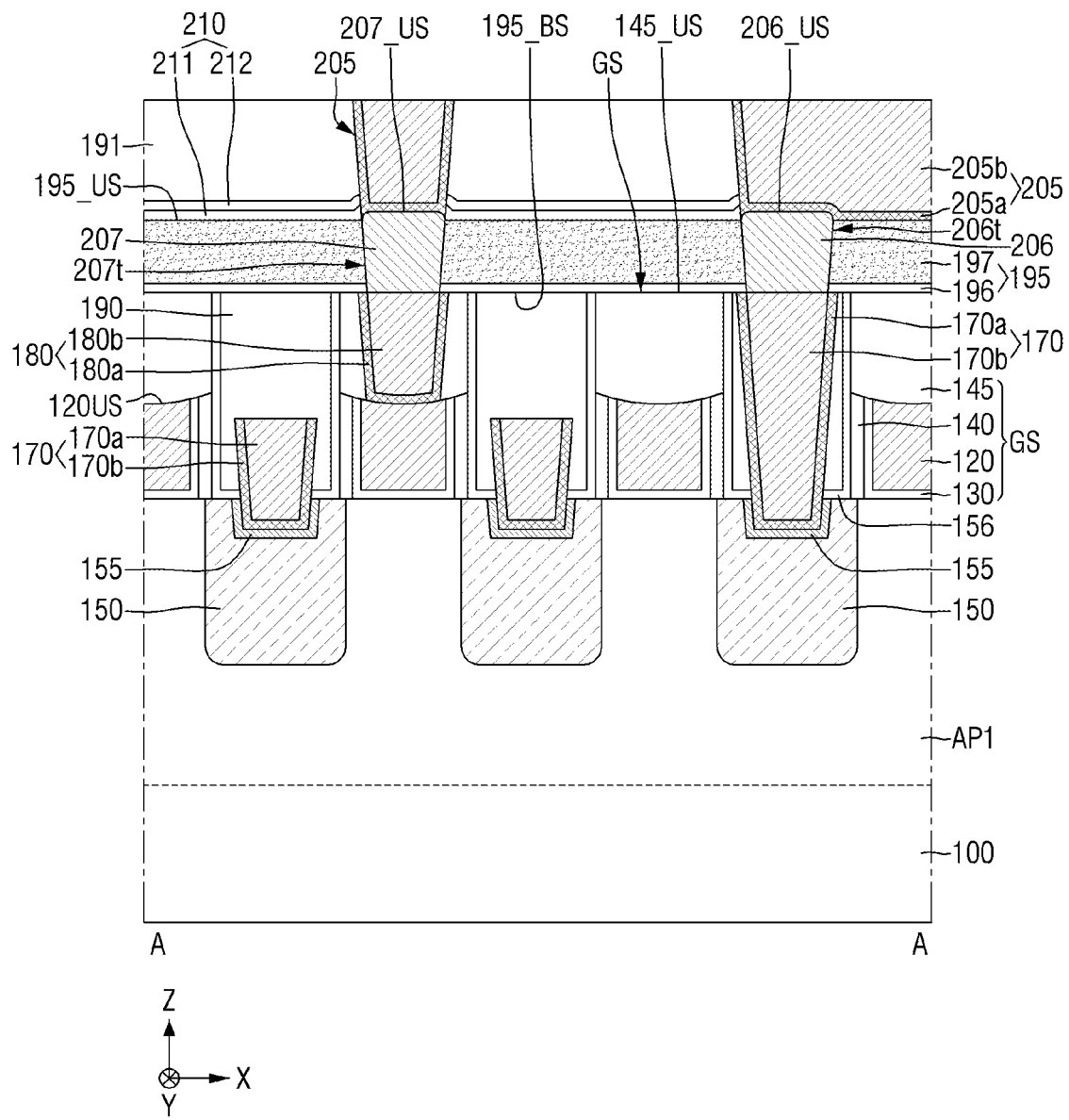

Referring to FIG. 12, in a semiconductor device according to some embodiments, the upper surface 206_US of the first via plug may protrude upward from the upper surface 195_US of the first etching stop film structure.

The upper surface 207_US of the second via plug may protrude upward from the upper surface 195_US of the first etching stop film structure.

In view of the fabricating process, the second etching stop film structure 210 may be formed in a state in which the upper surface 206_US of the first via plug and/or the upper surface 207_US of the second via plug protrude. In the region which forms the boundary with the first via plug 206 and the second via plug 207, at least one of the second lower etching stop film 211 and/or the second insertion etching stop film 212 may include a portion extending in the third direction Z.

Figure 13:
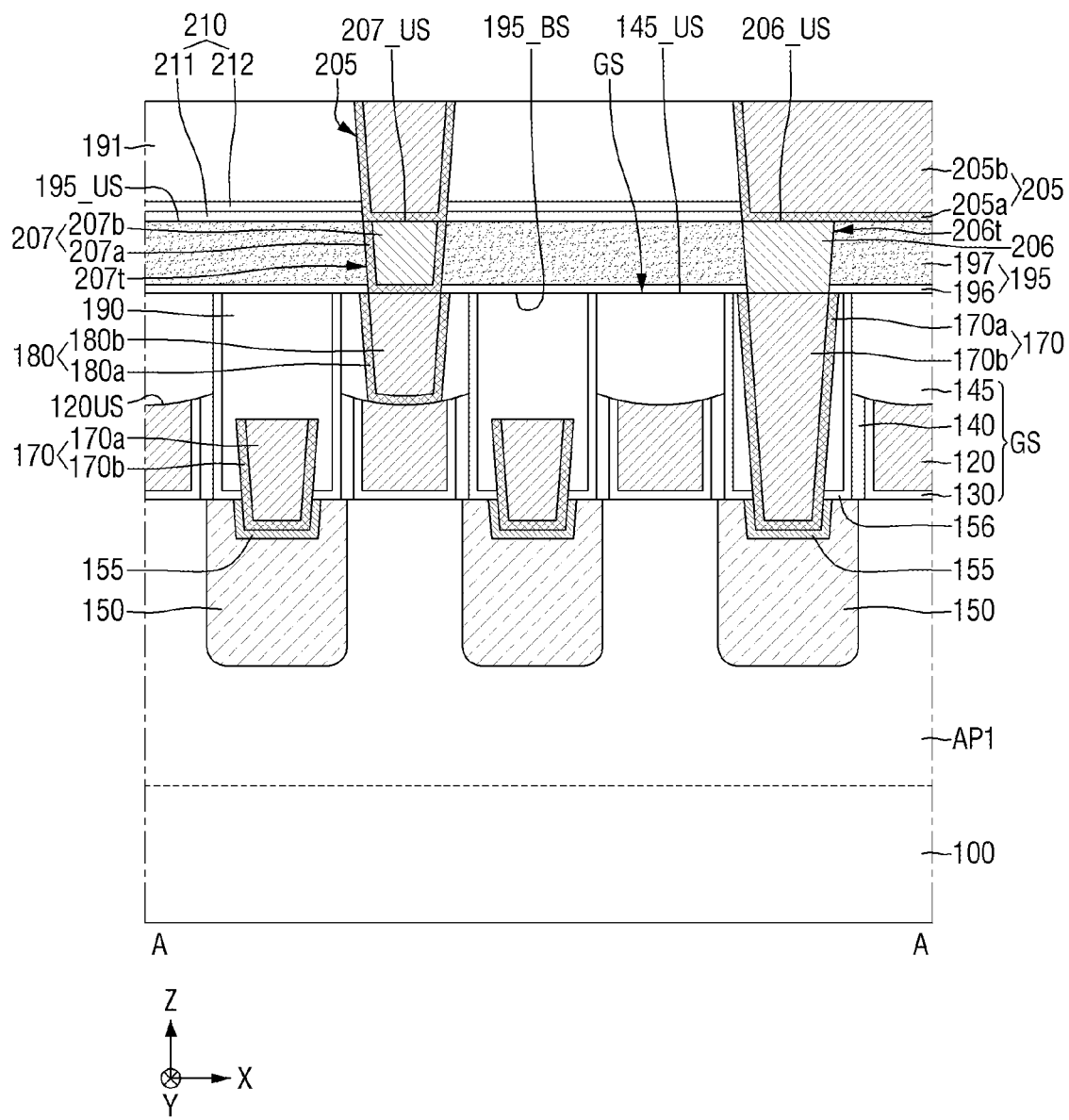
FIGS. 13 to 15 are diagrams that illustrate a semiconductor device according to some embodiments.
Figure 14:
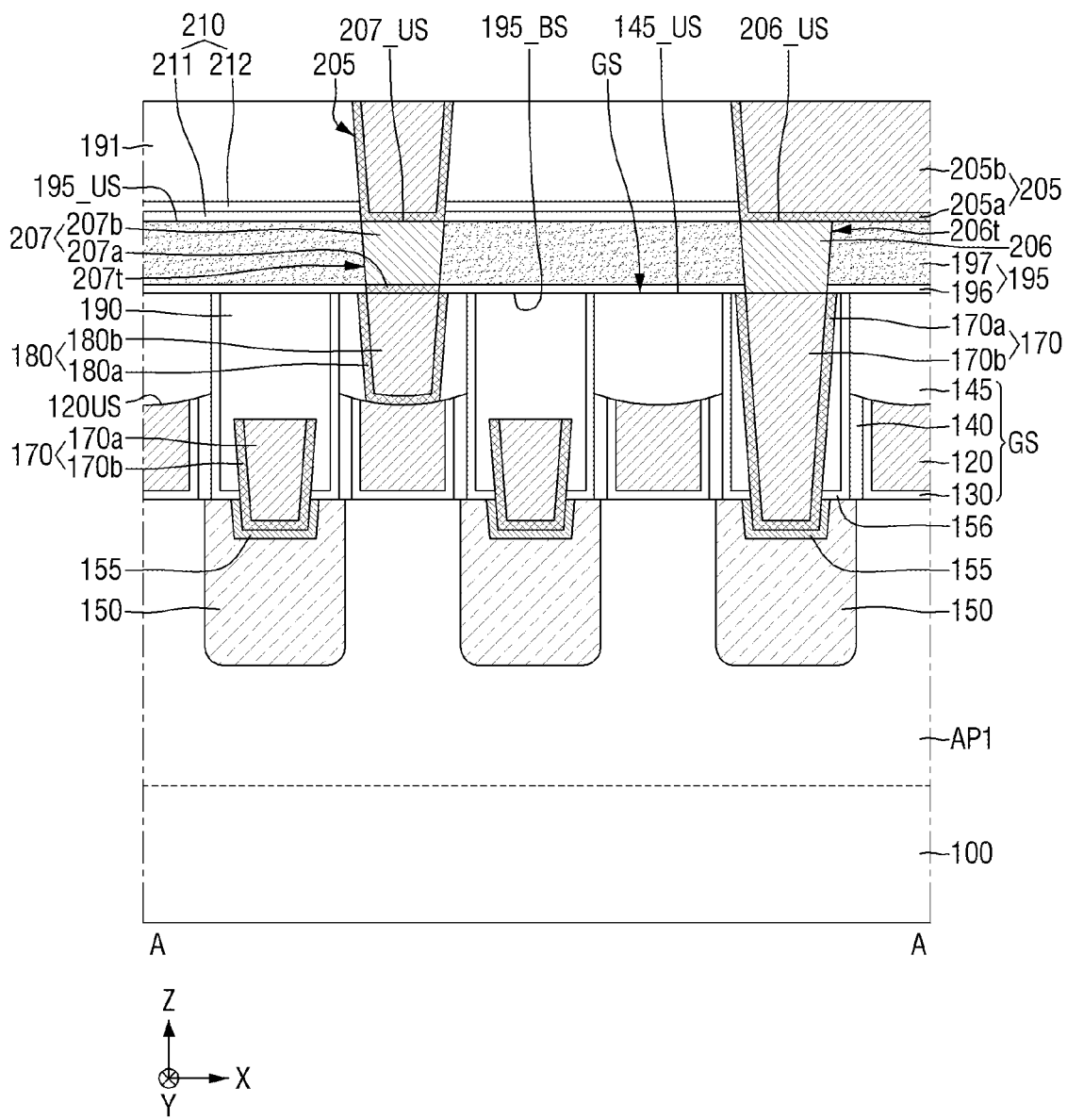
Figure 15:
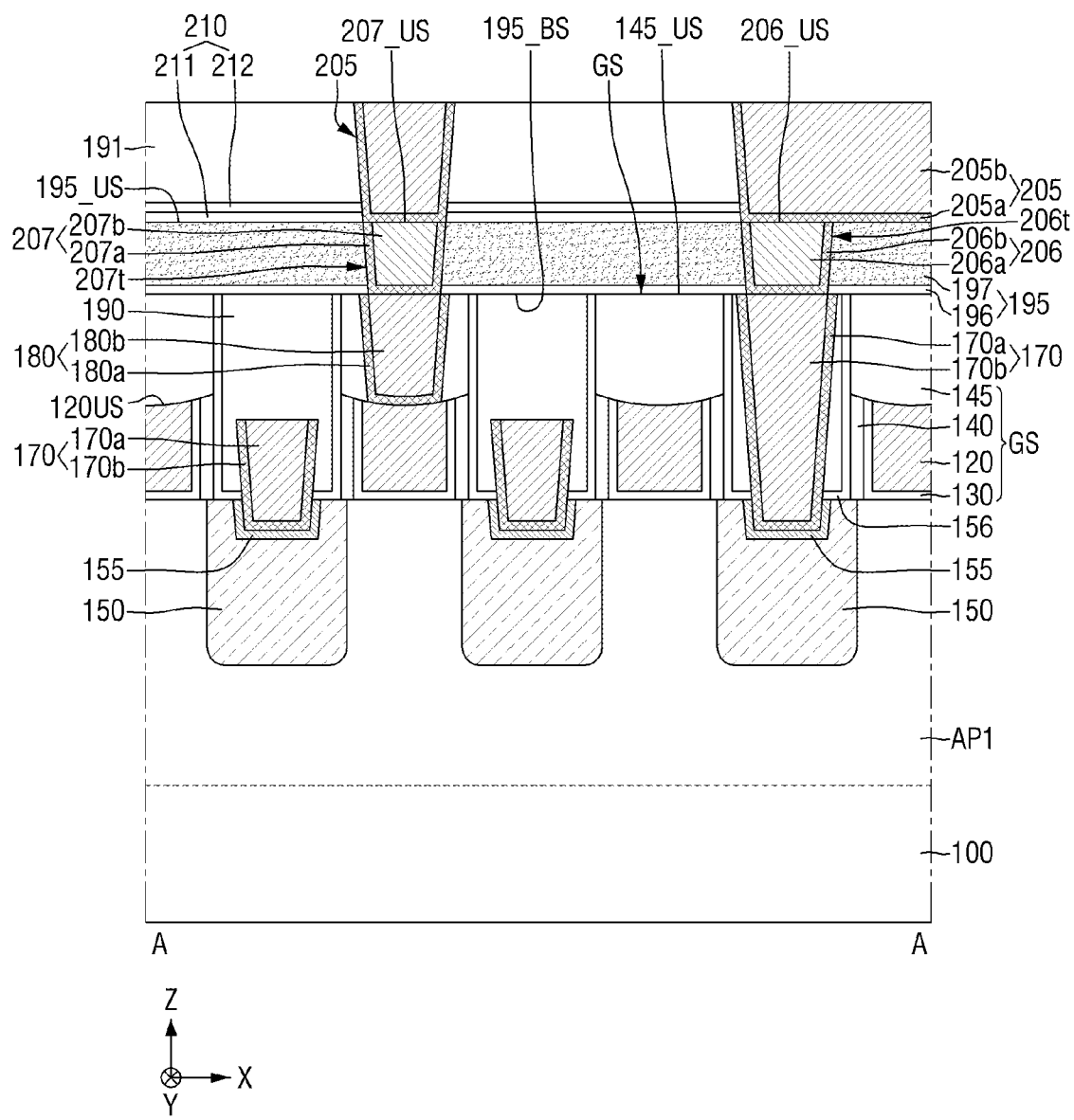

FIGS. 13 to 15 are diagrams that illustrate a semiconductor device according to some embodiments, respectively. For convenience of description, features different from those described using FIGS. 1 to 5C will be mainly described.

Referring to FIGS. 13 and 14, the second via plug 207 may include a second barrier conductive film 207a and a second plug conductive film 207b.

The second plug conductive film 207b may be formed on the second barrier conductive film 207a. For example, the second via plug 207 may have a multi-film structure. That is, the second via plug 207 may have a multi-conductive film structure.

In FIG. 13, the second barrier conductive film 207a may extend along the side wall of the second via hole 207t and the bottom surface of the second via hole 207t. The second barrier conductive film 207a may extend along the side walls and bottom surface of the second plug conductive film 207b.

In FIG. 14, the second barrier conductive film 207a does not extend along the side wall of the second plug conductive film 207b. The second barrier conductive film 207a extends along the bottom surface of the second via hole 207t, and does not extend along the side wall of the second via hole 207t.

Unlike the shown configuration, the second via plug 207 may have a single, monolithic conductive film structure, and the first via plug 206 may have a multi-conductive film structure.

Referring to FIG. 15, in the semiconductor device according to some embodiments, the first via plug 206 may include a first barrier conductive film 206a and a first plug conductive film 206b. The second via plug 207 may include a second barrier conductive film 207a and a second plug conductive film 207b.

The first via plug 206 and the second via plug 207 may each have a multi-film structure. That is, the first via plug 206 and the second via plug 207 may have a multi-conductive film structure.

In FIGS. 13 to 15, the contents of the materials included in the barrier conductive films 206a and 207a and the plug conductive films 206b and 207b may be the same as the description of the first source/drain barrier film 170a and the first source/drain filling film 170b.

Figure 16:
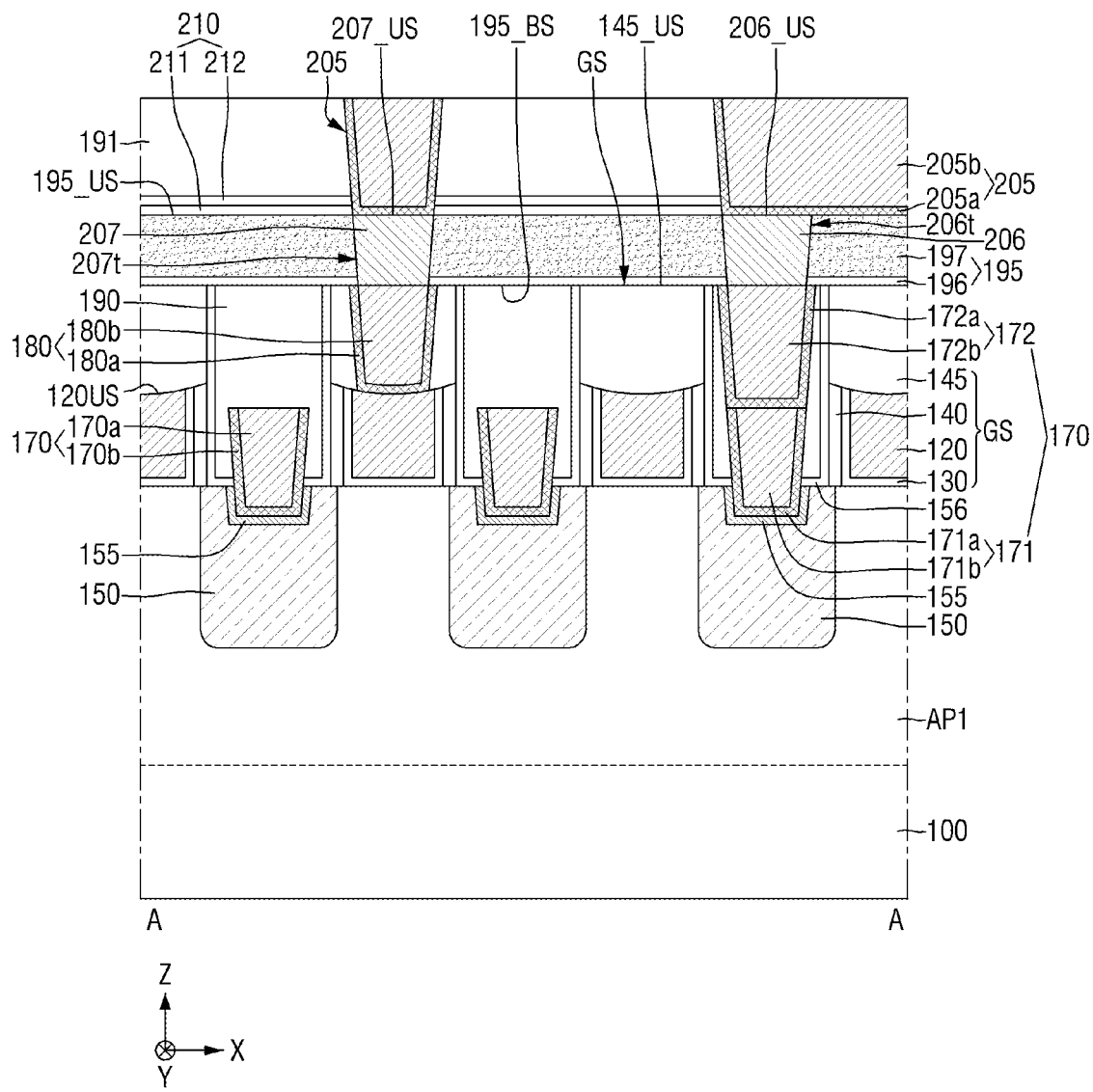
FIGS. 16 and 17 are diagrams that illustrate a semiconductor device according to some embodiments.
Figure 17:
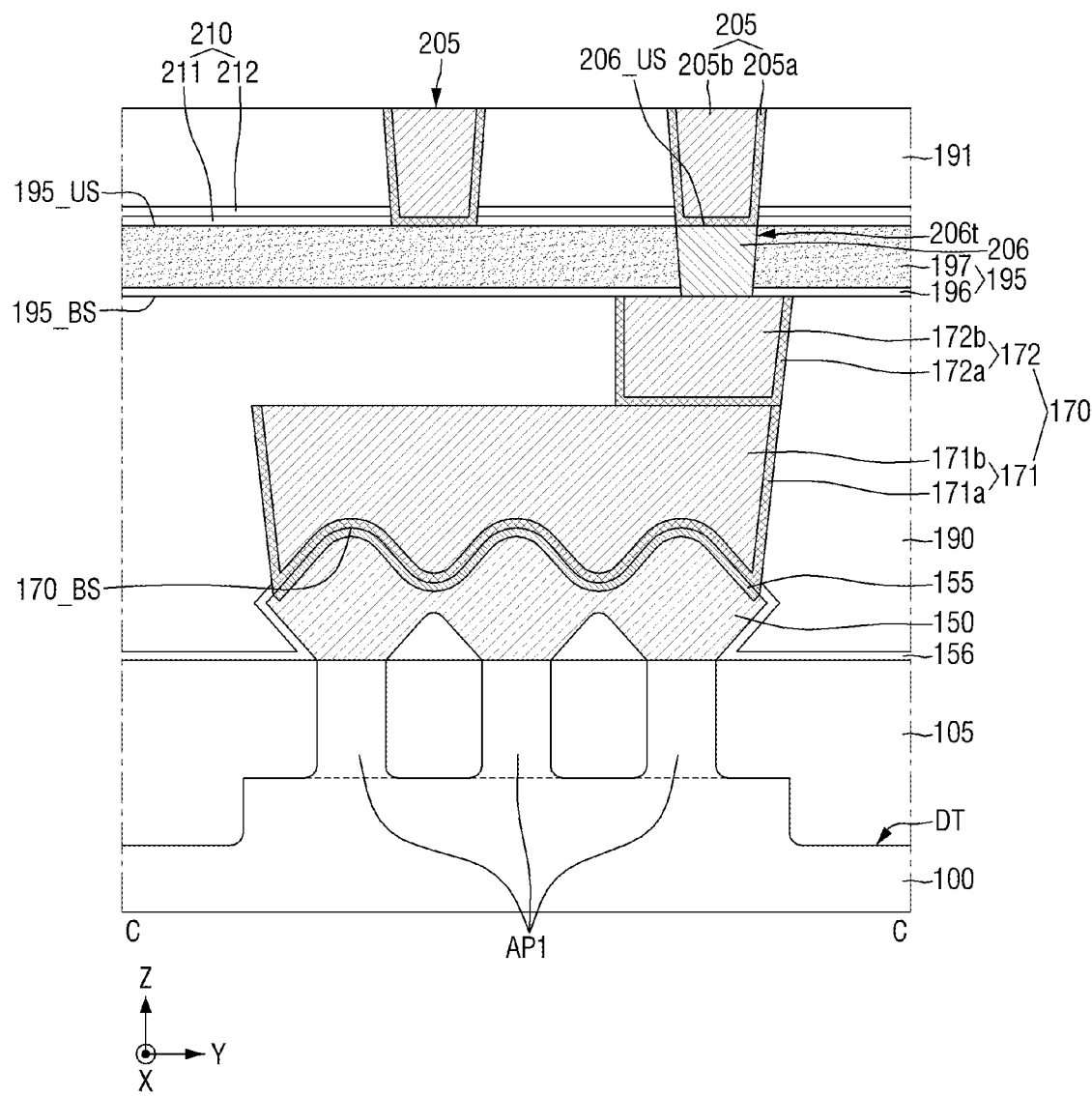

FIGS. 16 and 17 are diagrams that illustrate a semiconductor device according to some embodiments. For convenience of explanation, features different from those described using FIGS. 1 to 5C will be mainly described.

Referring to FIGS. 16 and 17, in the semiconductor device according to some embodiments, the first source/drain contact 170 may include a lower source/drain contact 171 and an upper source/drain contact 172.

The lower source/drain contact 171 may include a lower source/drain barrier film 171a and a lower source/drain filling film 171b. The upper source/drain contact 172 may include an upper source/drain barrier film 172a and an upper source/drain filling film 172b.

The upper surface of the first source/drain contact 170 may be the upper surface of the upper source/drain contact 172.

The contents of the materials included in the lower source/drain barrier film 171a and the upper source/drain barrier film 172a may be the same as the description of the first source/drain barrier film 170a. The contents of the materials included in the lower source/drain filling film 171b and the upper source/drain filling film 172b may be the same as the description of the first source/drain filling film 170b.

As an example, a height from the upper surface of the first active pattern AP1 to the upper surface 120US of the first gate electrode may be greater than a height from the upper surface of the first active pattern AP1 to the upper surface of the lower source/drain contact 171. As another example, the height from the upper surface of the first active pattern AP1 to the upper surface 120US of the first gate electrode may be the same as the height from the upper surface of the first active pattern AP1 to the upper surface of the lower source/drain contact 171. As still another example, the height from the upper surface of the first active pattern AP1 to the upper surface 120US of the first gate electrode may be less than the height from the upper surface of the first active pattern AP1 to the upper surface of the lower source/drain contact 171.

The first via plug 206 is connected to the upper source/drain contact 172.

FIGS. 18 to 21 are diagrams that illustrate a semiconductor device according to some embodiments. For convenience of explanation, features different from those described using FIGS. 1 to 5C will be mainly described.

Figure 18:
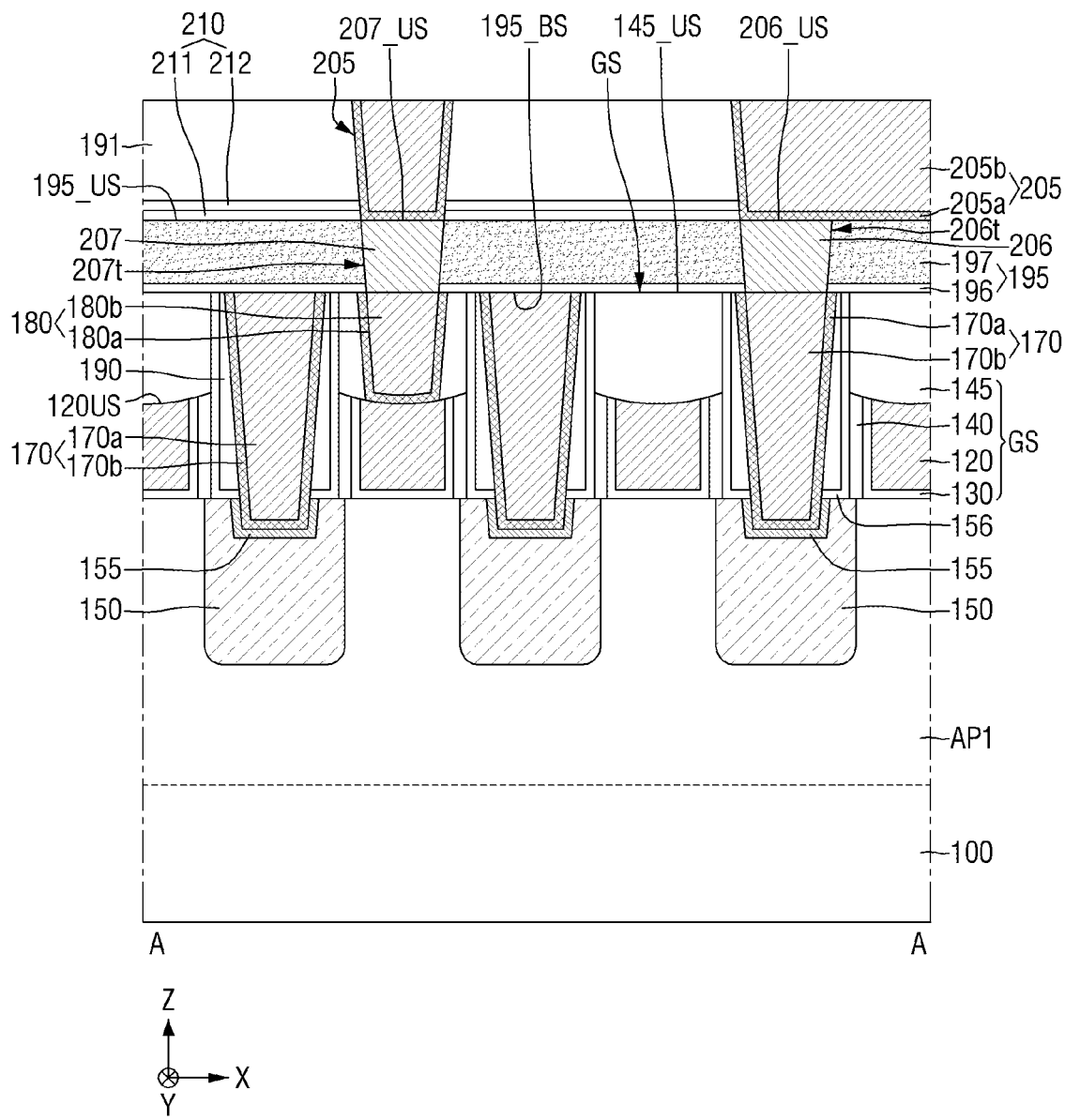
FIGS. 18 to 21 are diagrams that illustrate a semiconductor device according to some embodiments.

Referring to FIG. 18, in the semiconductor device according to some embodiments, the height of the first source/drain contact 170 may be constant on the basis of the upper surface of the first active pattern AP1, regardless of whether the first via plug 206 is connected or contacted.

When the first source/drain contact 170 includes a first portion on which the first via plug 206 is not connected or contacted, and a second portion on which the first via plug 206 is connected or contacted, the height of the upper surface of the second portion of the first source/drain contact 170 may be the same as the height of the upper surface of the first portion of the first source/drain contact 170.

Figure 19:
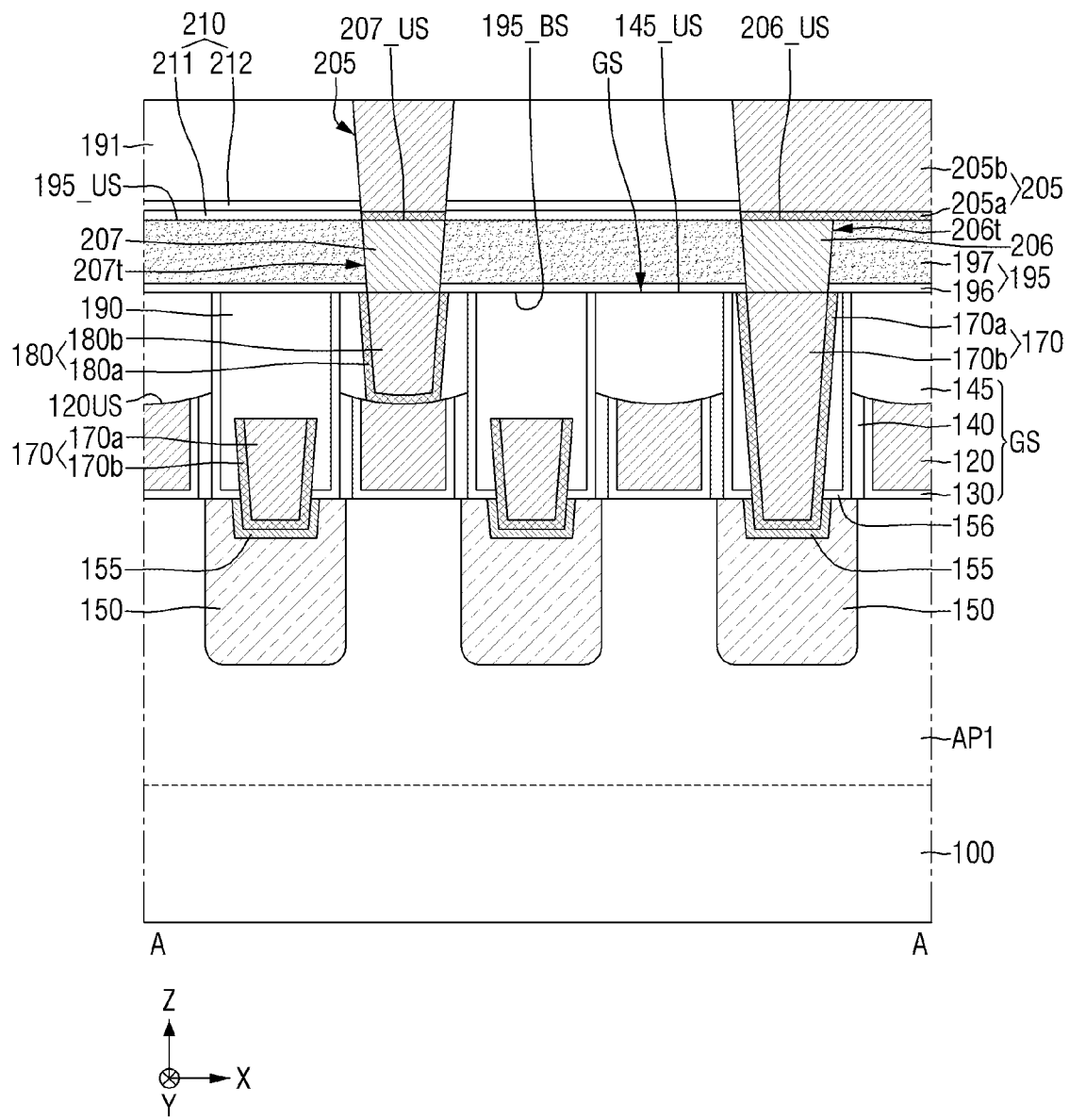

Referring to FIG. 19, in a semiconductor device according to some embodiments, the wiring barrier film 205a does not extend along the side wall of the wiring filling film 205b.

Figure 20:
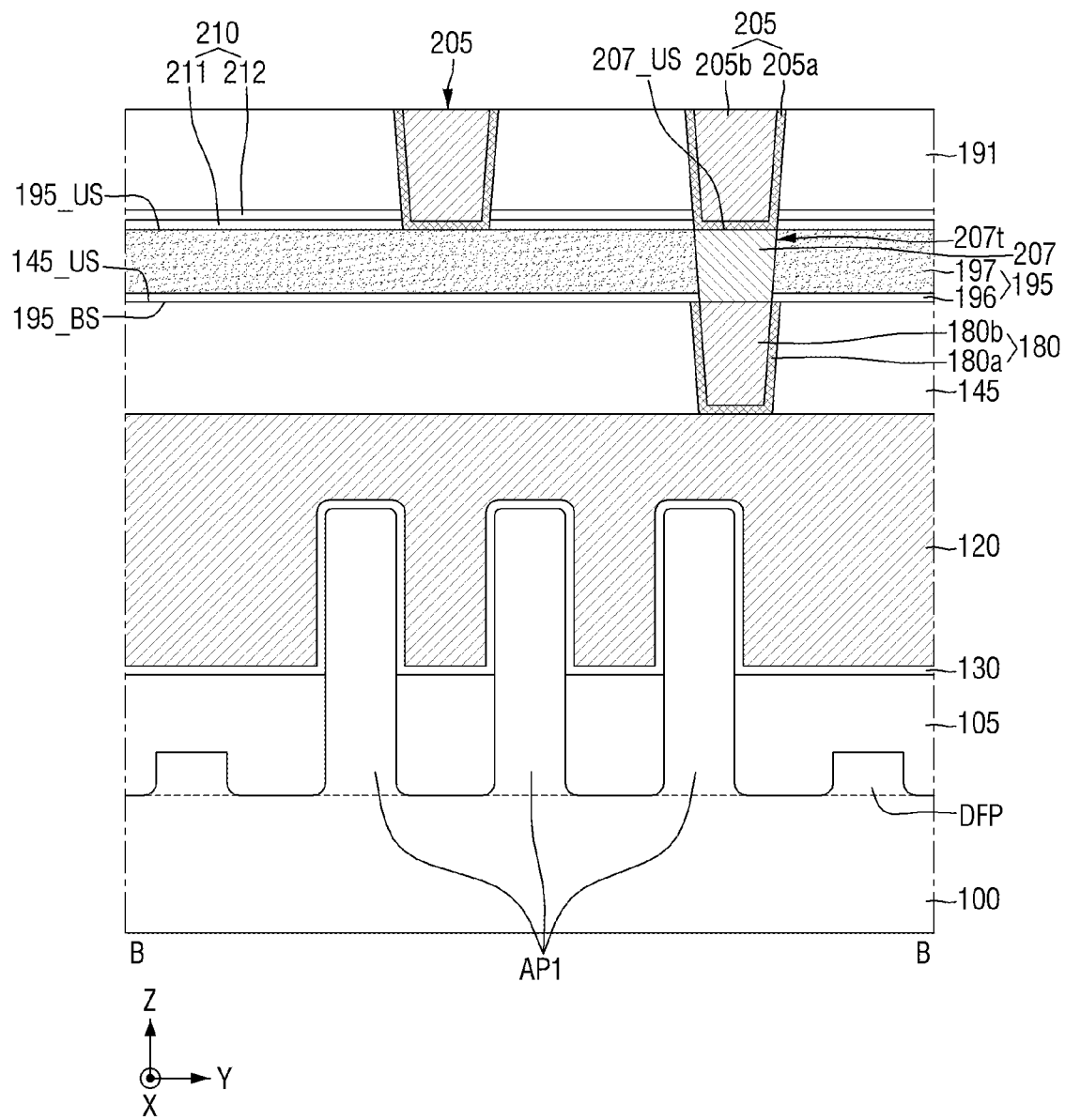

Referring to FIG. 20, a semiconductor device according to some embodiments may include a dummy protrusion pattern DFP formed in the field region FX.

The deep trench (DT of FIG. 3) is not formed in the field region FX. The upper surface of the dummy protrusion pattern DFP is covered or overlaps in the third direction Z with the field insulating film 105.

Figure 21:
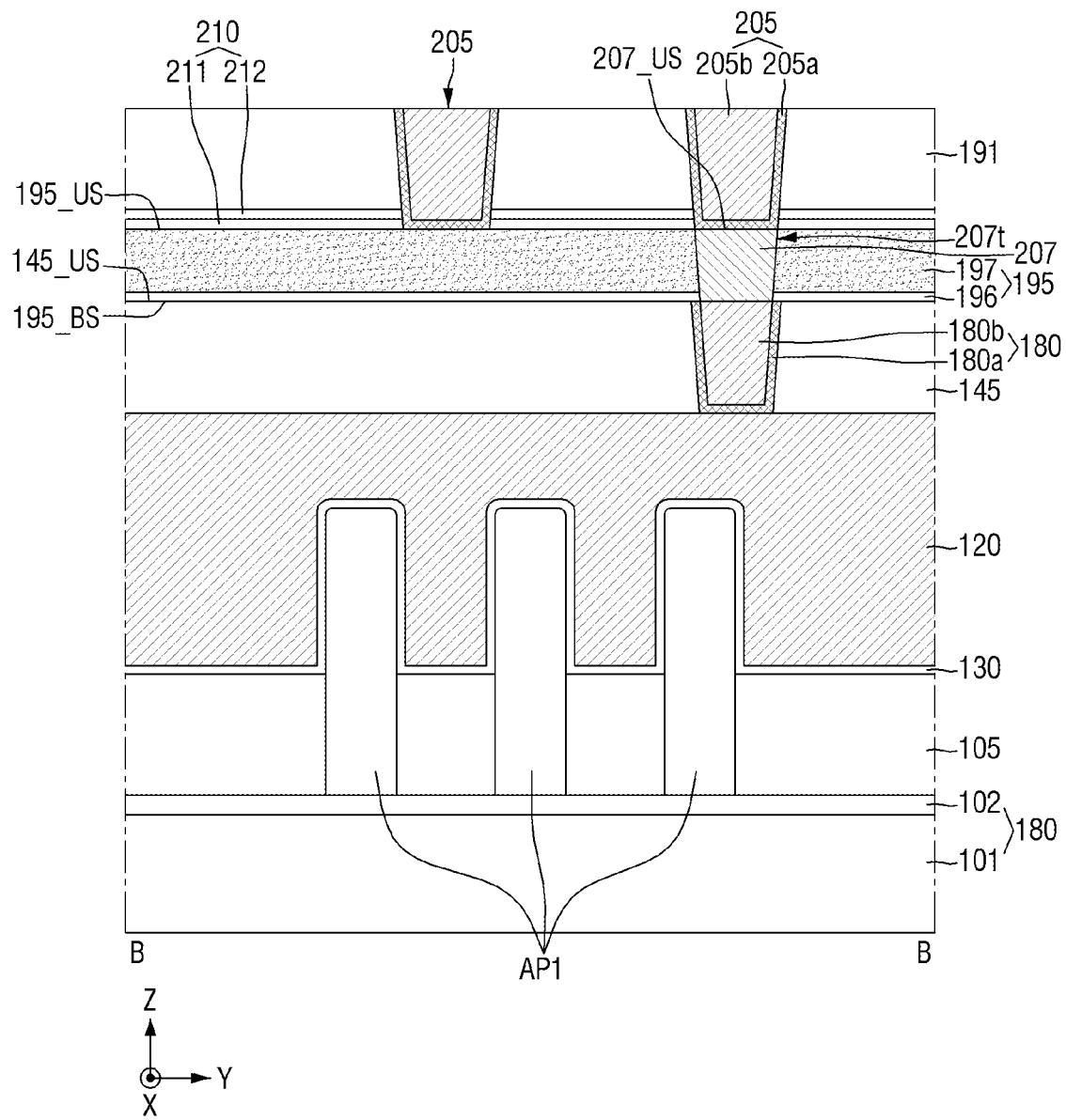

Referring to FIG. 21, in a semiconductor device according to some embodiments, the substrate 100 may include a base substrate 101, and a buried insulating film 102 on the base substrate 101.

The base substrate 101 may include, but is not limited to, a semiconductor material. The buried insulating film 102 may be formed entirely along the upper surface of the base substrate 101. The buried insulating film 102 may include an insulating material.

Figure 22:
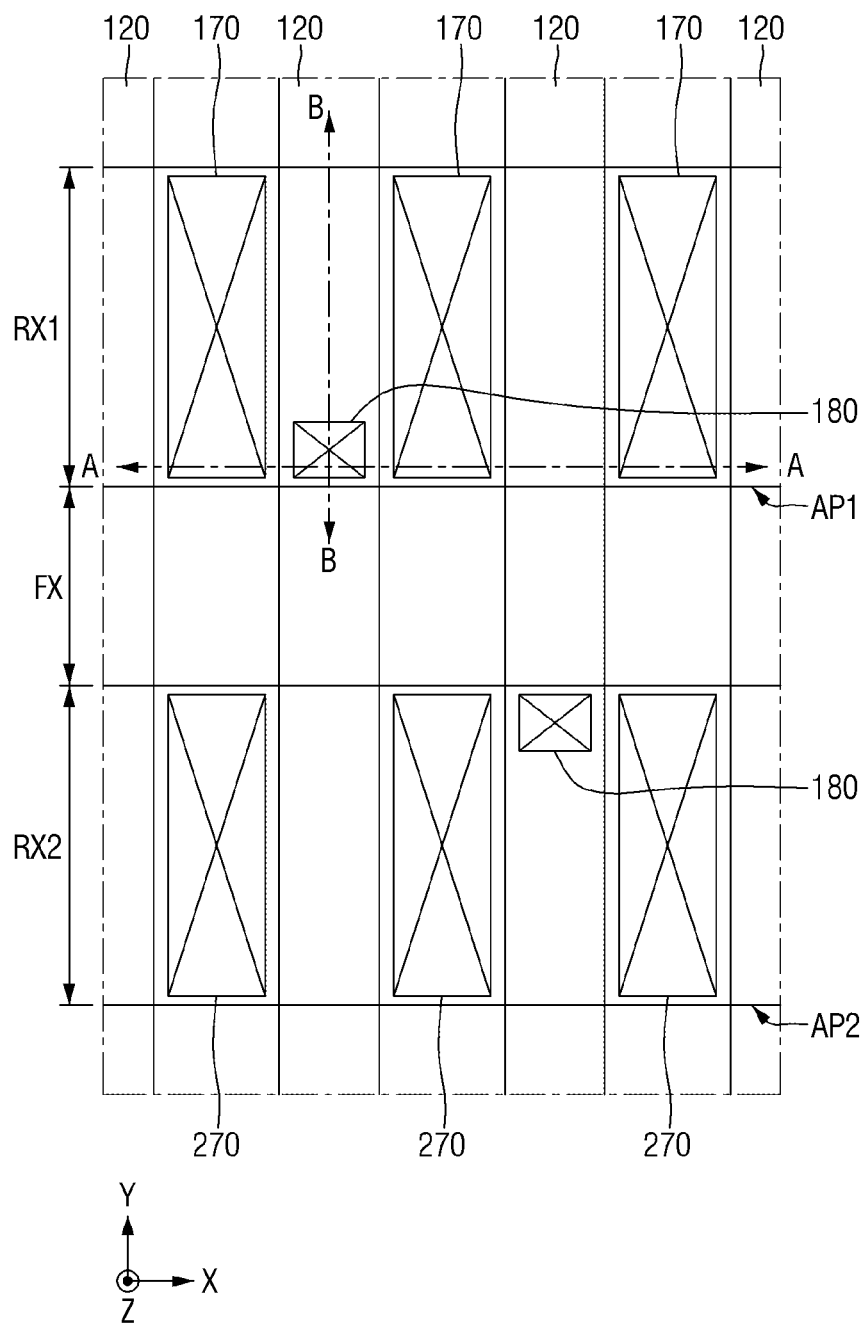
FIGS. 22 to 25 are diagrams that illustrate a semiconductor device according to some embodiments.
Figure 23:
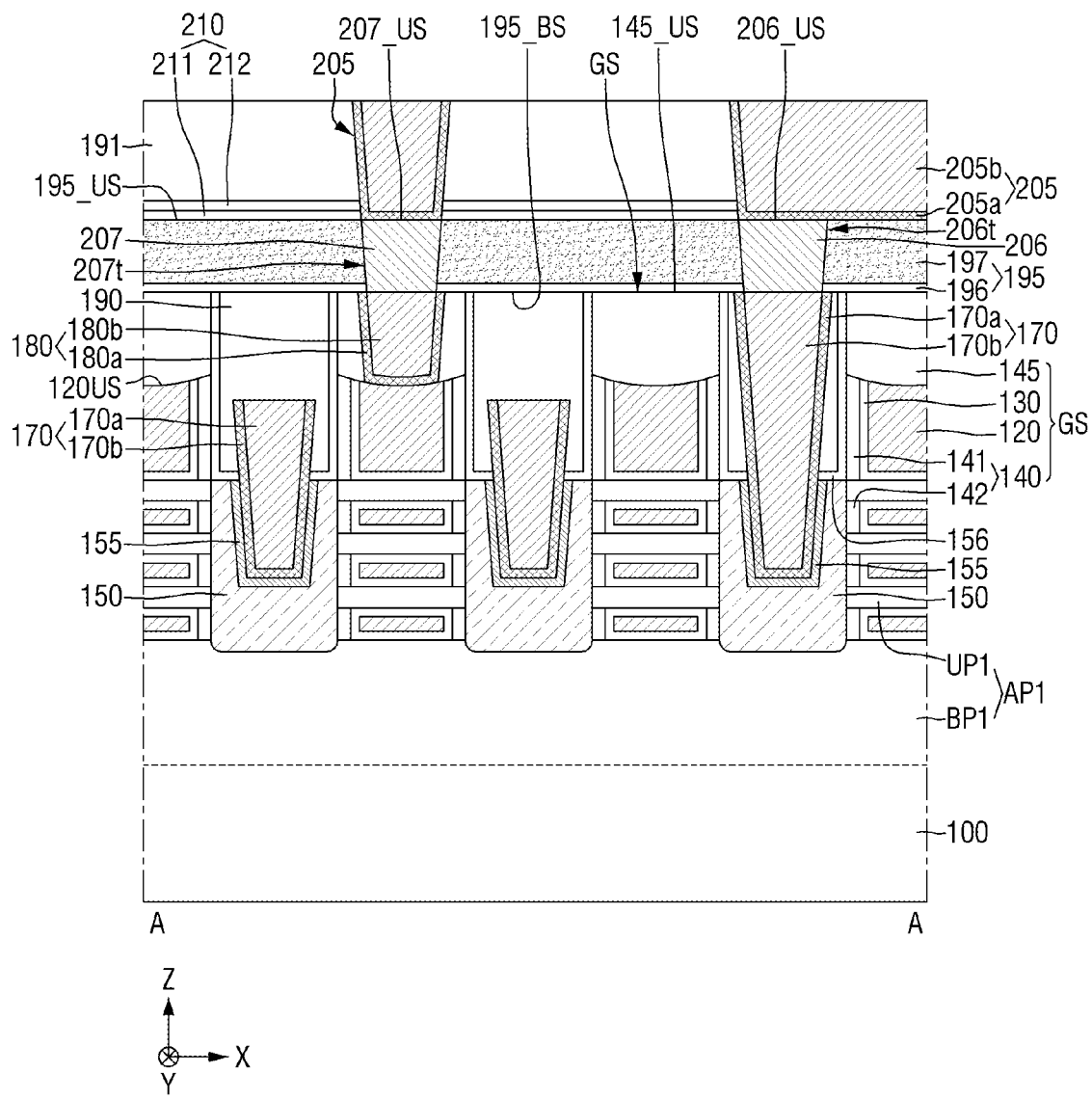
Figure 24:
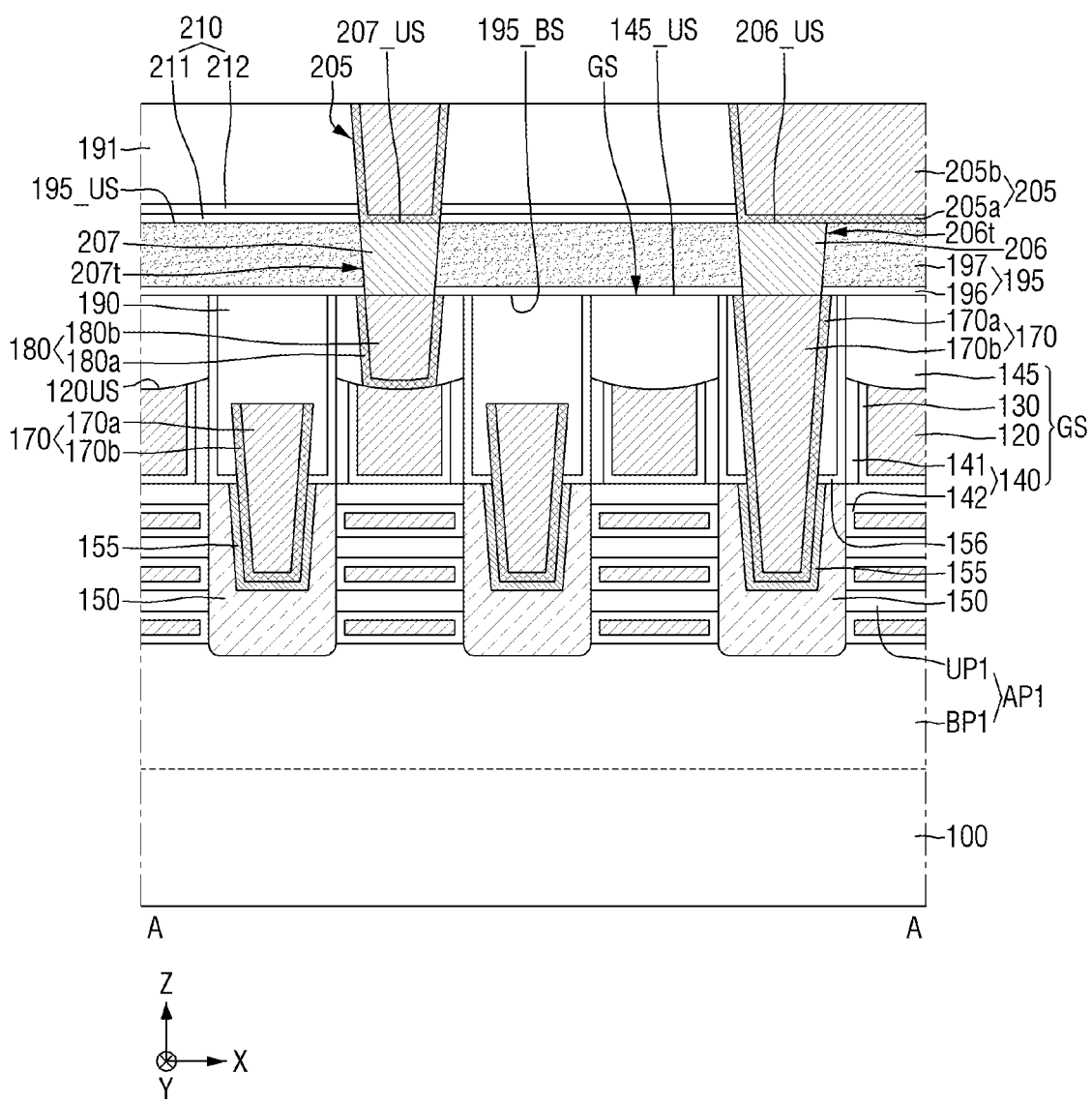
Figure 25:
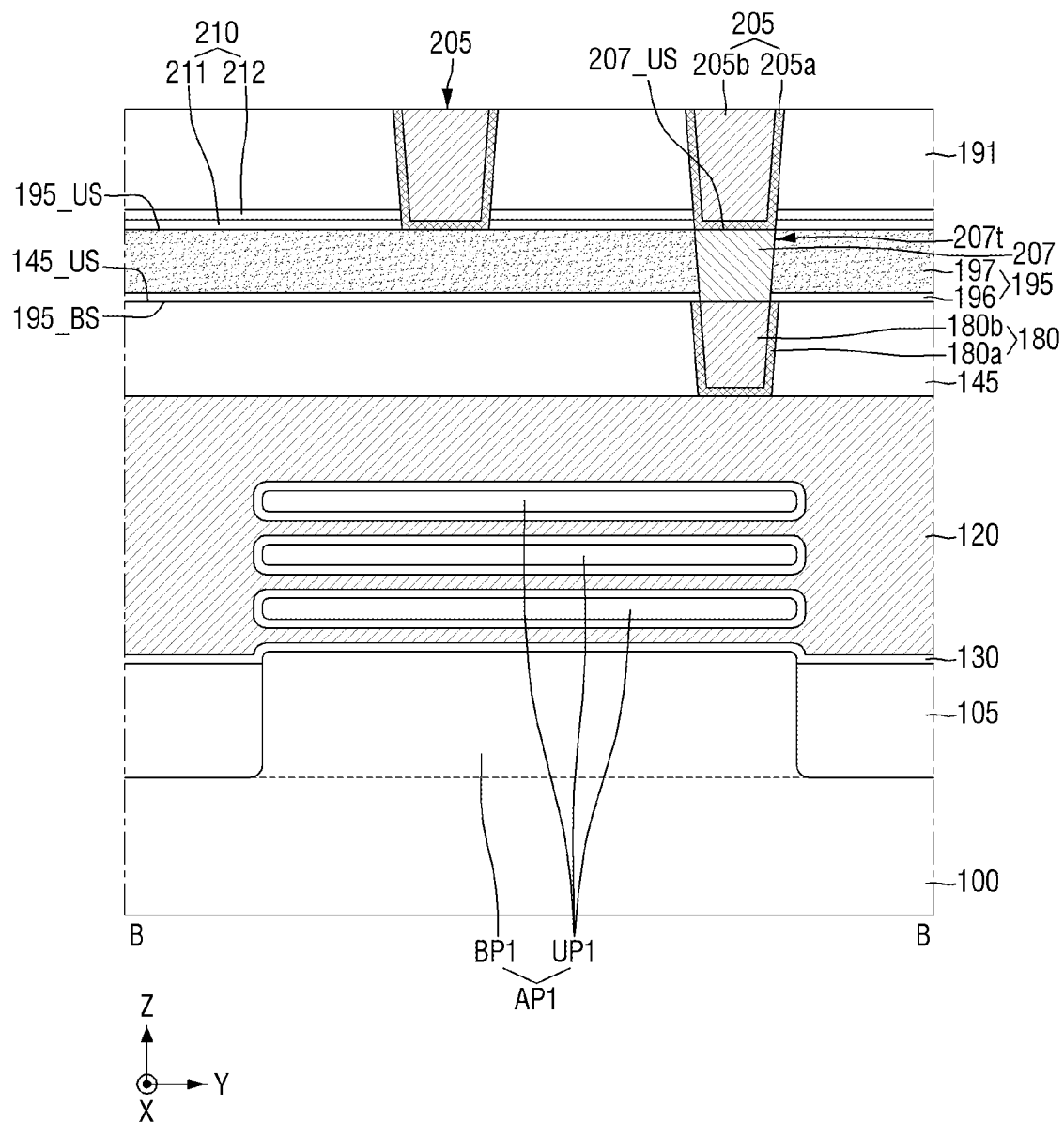

FIGS. 22 to 25 are diagrams that illustrate a semiconductor device according to some embodiments. FIG. 22 is an example layout diagram that illustrates a semiconductor device according to some embodiments. FIGS. 23 and 24 are example cross-sectional views taken along line A-A of FIG. 22, respectively. FIG. 25 is a cross-sectional view taken along line B-B of FIG. 22. For convenience of description, features different from those described using FIGS. 1 to 5C will be mainly described.

Referring to FIGS. 22 to 25, in a semiconductor device according to some embodiments, the first active pattern AP1 may include a lower pattern BP1 and a sheet pattern UP1.

Although not shown, the second active pattern AP2 may include a lower pattern and a sheet pattern.

The lower pattern BP1 may extend along the first direction X. The sheet pattern UP1 may be formed on the lower pattern BP1 and spaced apart from the lower pattern BP1.

The sheet pattern UP1 may include a plurality of sheet patterns stacked in the third direction Z. Although three sheet patterns UP1 are shown, this is only for convenience of description, and embodiments of the inventive concept are not limited thereto.

The sheet pattern UP1 may be connected to the first source/drain pattern 150. The sheet pattern UP1 may be a channel pattern used as a channel region of the transistor. For example, the sheet pattern UP1 may be a nanosheet or nanowire.

The lower pattern BP1 may include, for example, silicon or germanium, which are elemental semiconductor materials. In other embodiments, the lower pattern BP1 may include a compound semiconductor, and may include, for example, a group IV-IV compound semiconductor or a group III-V compound semiconductor.

The sheet pattern UP1 may include, for example, silicon or germanium, which are elemental semiconductor materials. In other embodiments, the sheet pattern UP1 may include a compound semiconductor, and may include, for example, a group IV-IV compound semiconductor or a group III-V compound semiconductor.

The first gate insulating film 130 may extend along the upper surface of the lower pattern BP1 and the upper surface of the field insulating film 105. The first gate insulating film 130 may wrap around the sheet pattern UP1.

The first gate electrode 120 is formed on the lower pattern BP1. The first gate electrode 120 intersects the lower pattern BP1. The first gate electrode 120 may wrap around the sheet pattern UP1. The first gate electrode 120 may be located between the lower pattern BP1 and the sheet pattern UP1, and between the adjacent sheet patterns UP1.

In FIG. 23, the first gate spacer 140 may include an outer spacer 141 and an inner spacer 142. The inner spacer 142 may be located between the lower pattern BP1 and the sheet pattern UP1, and between the adjacent sheet patterns UP1.

In FIG. 24, the first gate spacer 140 may include only the outer spacer 141. No inner spacer is located between the lower pattern BP1 and the sheet pattern UP1, and between the adjacent sheet patterns UP1.

The bottom surface of the first source/drain contact 170 may be located between the upper surface of the sheet pattern UP1 positioned at the lowermost part among the plurality of sheet patterns UP1 and the lower surface of the sheet pattern UP1 positioned at the uppermost part. Unlike the shown configuration, the bottom surface of the first source/drain contact 170 may be located between the upper surface of the sheet pattern UP1 positioned at the uppermost part and the lower surface of the sheet pattern UP1 positioned at the uppermost part.

Figure 26:
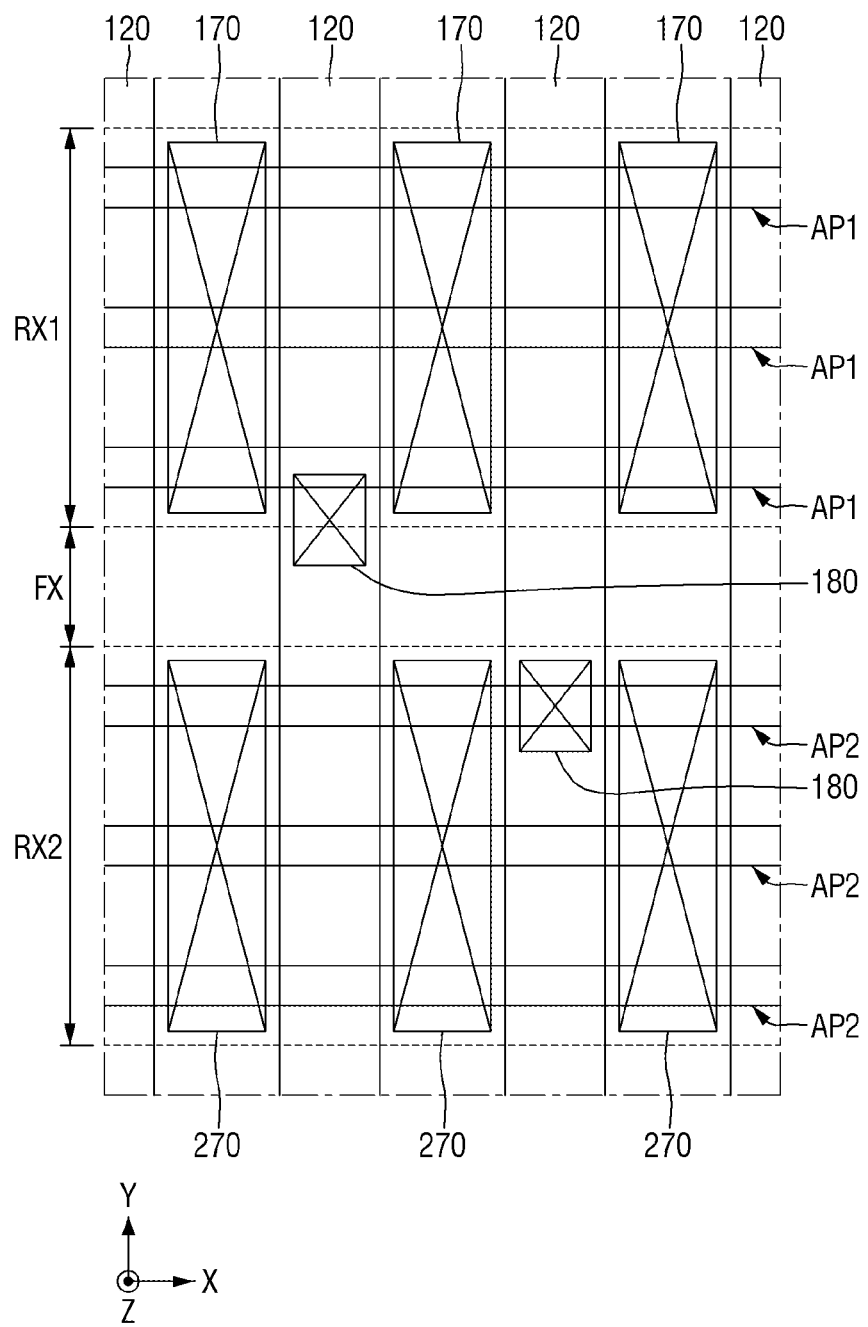
FIGS. 26 and 27 are example layout diagrams that illustrate a semiconductor device according to some embodiments.
Figure 27:
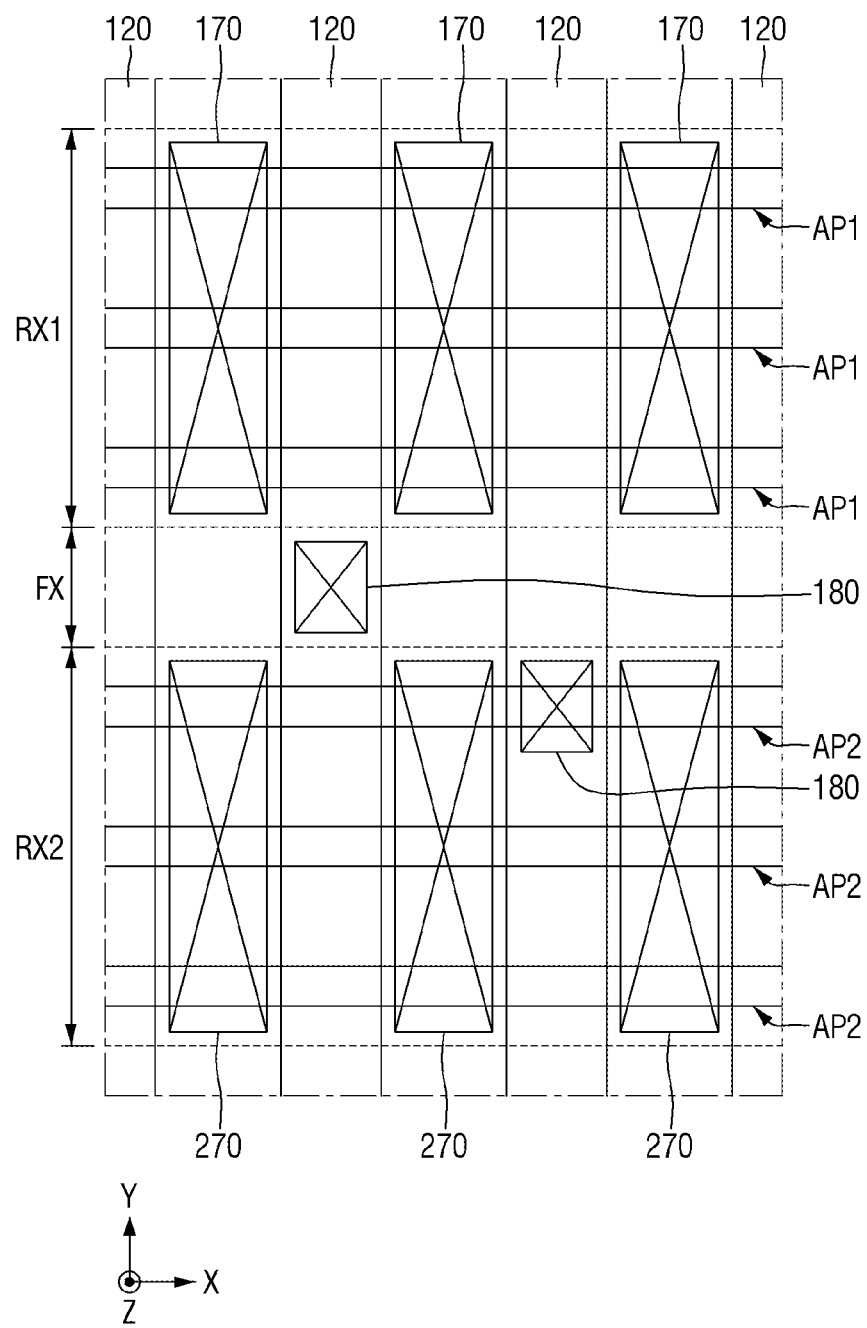

FIGS. 26 and 27 are example layout diagrams that illustrate a semiconductor device according to some embodiments. For convenience of explanation, features different from those described using FIGS. 1 to 5C will be mainly described.

Referring to FIG. 26, in a semiconductor device according to some embodiments, at least one of the first gate contacts 180 may be placed over the active regions RX1 and RX2 and the field region FX from the planar viewpoint.

For example, a part of the first gate contact 180 may be placed at a position where it overlaps the first active region RX1.

Referring to FIG. 27, in a semiconductor device according to some embodiments, at least one of the first gate contacts 180 may be entirely placed on the field region FX from the planar viewpoint.

At least one of the first gate contacts 180 may be placed at a position where it entirely overlaps the field region FX from the planar viewpoint.

In FIGS. 26 and 27, although at least one of the first gate contacts 180 is shown as being entirely placed on the second active region RX2, the embodiments of the inventive concept are not limited thereto.

In FIGS. 1, 26, and 27, a cross section (a drawing taken in the second direction Y) of each first source/drain contact 170, and a cross section of the second source/drain contact 270 may have an "L" shape or may have a "T" shape rotated by 180 degrees, depending on the position of the first gate contact 180.

In other embodiments, regardless of the position of the first gate contact 180, each of the first source/drain contact 170 and the second source/drain contact 270 may not include a recessed portion as shown in FIG. 4.

Figure 28:
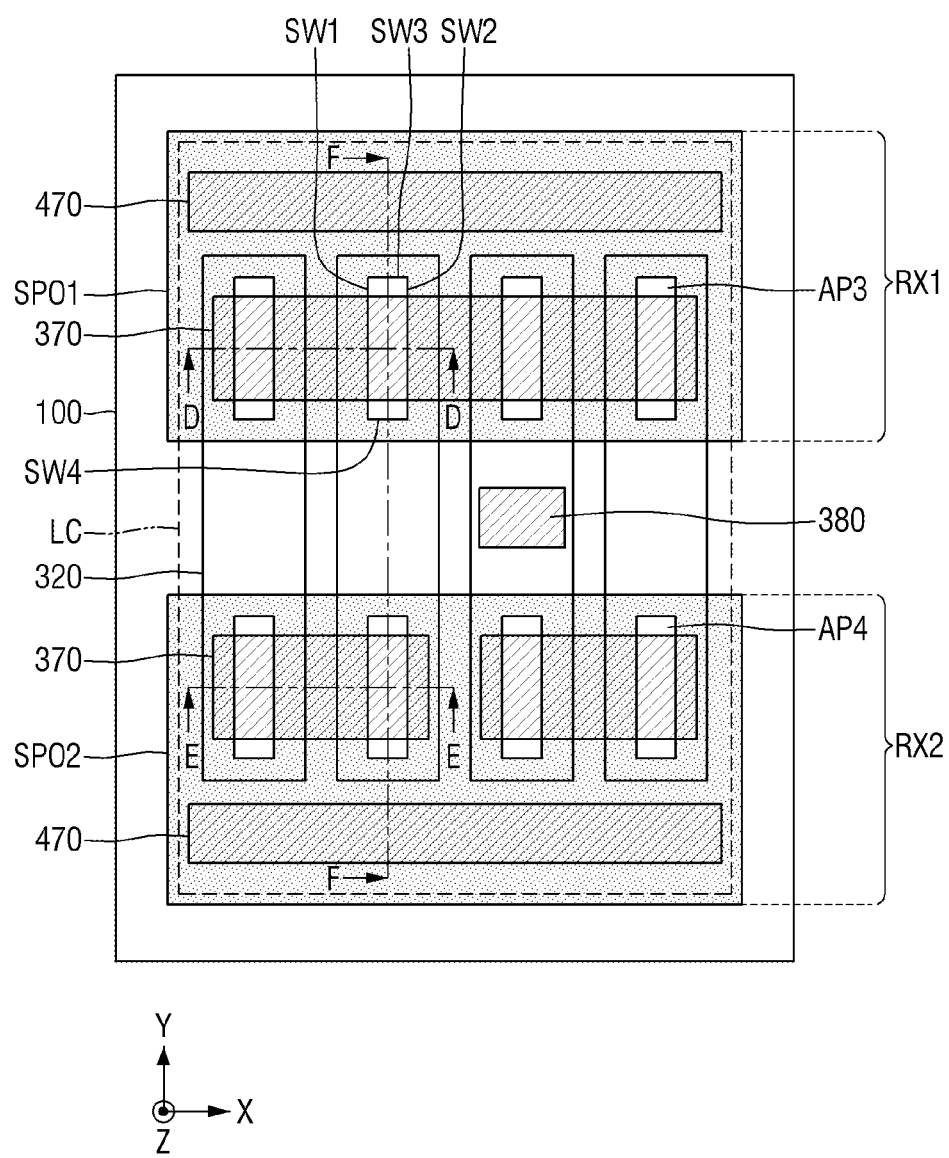
FIGS. 28 to 30 are diagrams that illustrate a semiconductor device according to some embodiments.
Figure 29:
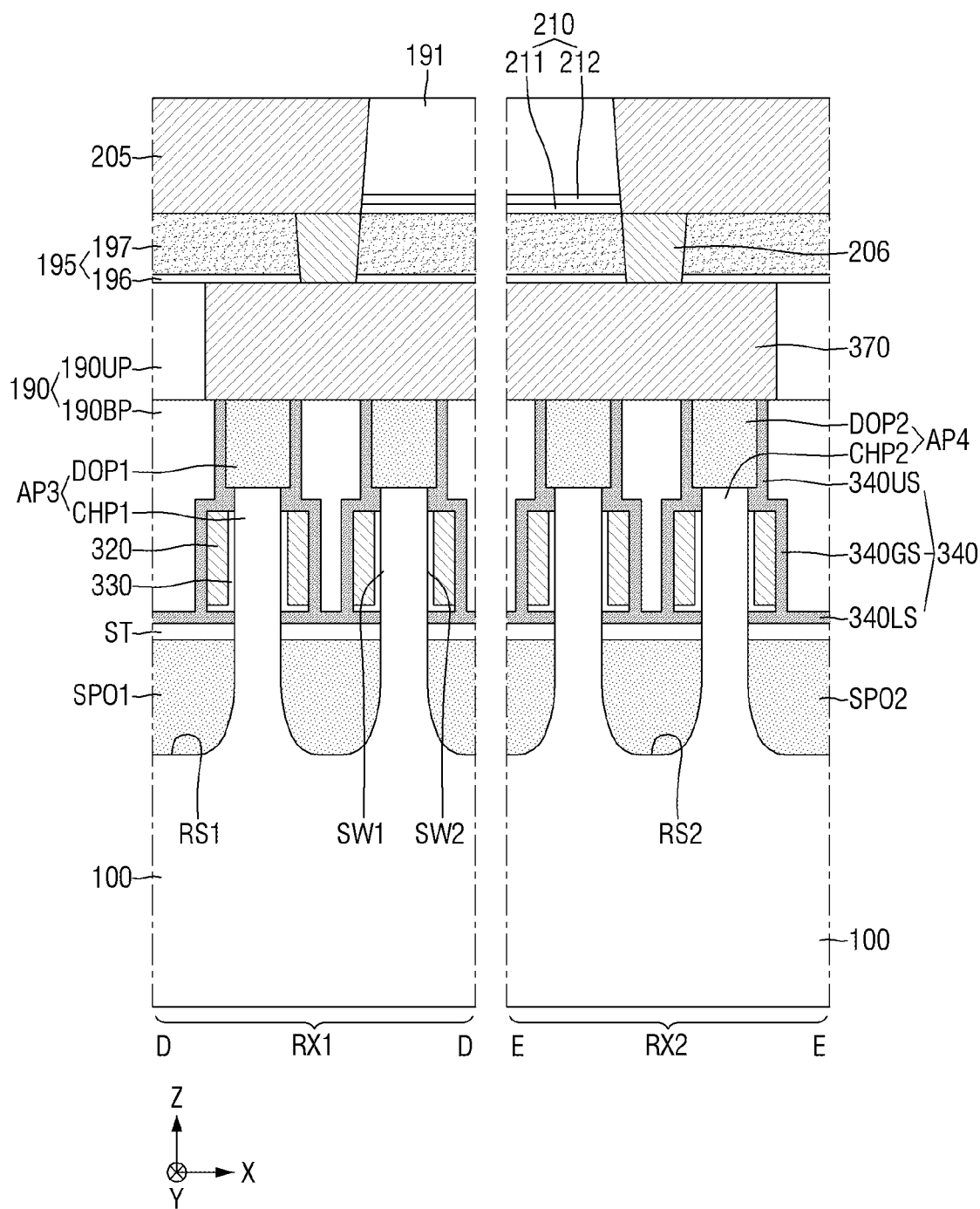
Figure 30:
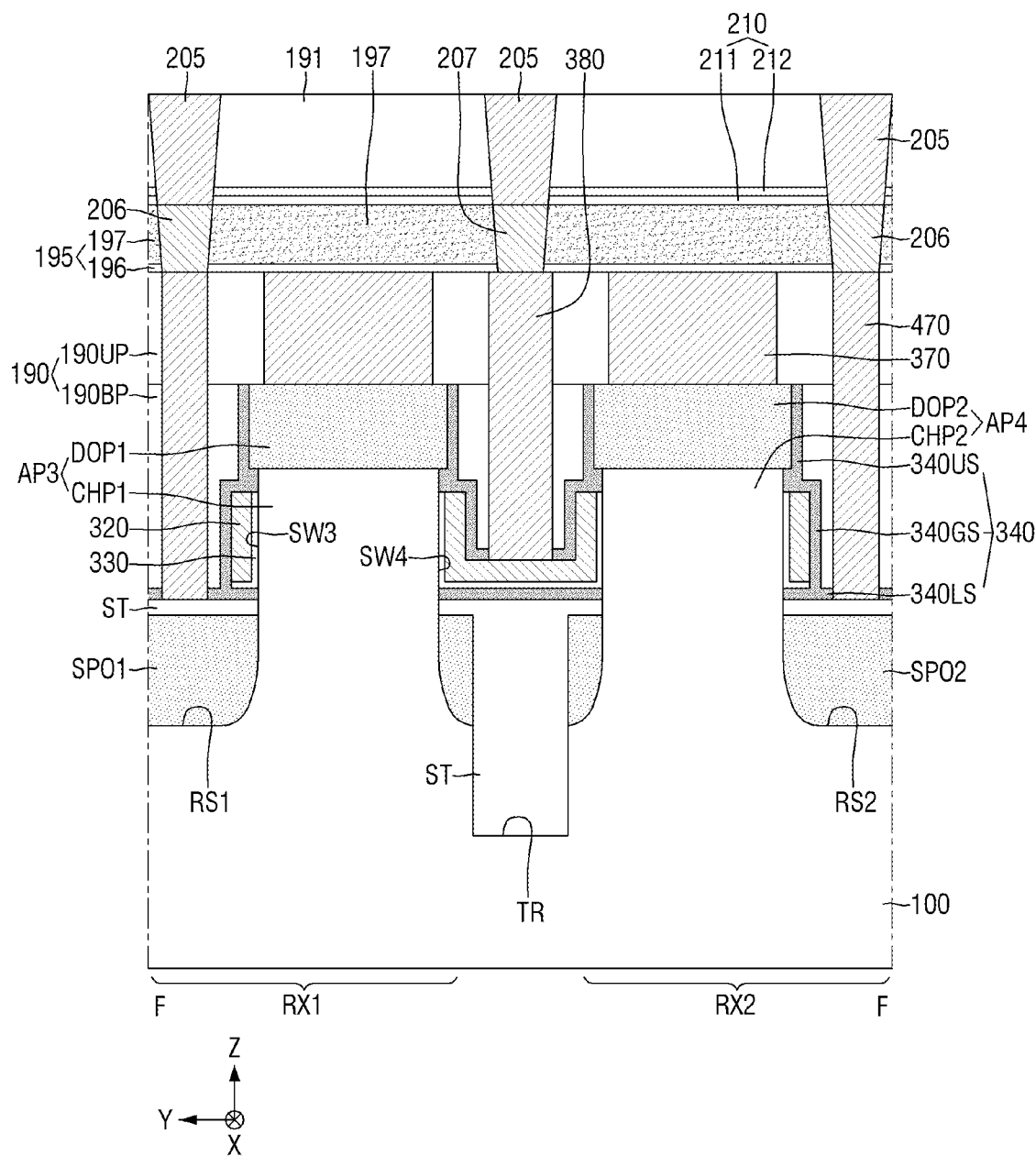

FIGS. 28 to 30 are diagrams that illustrate a semiconductor device according to some embodiments. For reference, FIG. 28 is a plan view that illustrates a semiconductor device according to some embodiments. FIG. 29 is a cross-sectional view taken along lines D-D and E-E of FIG. 28. FIG. 30 is a cross-sectional view taken along line F-F of FIG. 28.

Referring to FIGS. 28 to 30, a logic cell LC may be provided on the substrate 100. The logic cell LC may mean a logic element (e.g., an inverter, a flip-flop, etc.) that performs a particular function. The logic cell LC may include vertical transistors (Vertical FET) constituting the logic element, and wirings for connecting the vertical transistors to each other.

The logic cell LC on the substrate 100 may include a first active region RX1 and a second active region RX2. For example, the first active region RX1 may be a PMOSFET region, and the second active region RX2 may be an NMOSFET region. The first and second active regions RX1 and RX2 may be defined by the trench TR formed on the substrate 100. The first and second active regions RX1 and RX2 may be spaced apart from each other in the second direction Y.

A first lower epi-pattern SPO1 may be provided above (in the third direction Z) the first active region RX1, and a second lower epi-pattern SPO2 may be provided above (in the third direction Z) the second active region RX2. From the planar viewpoint, the first lower epi-pattern SPO1 may overlap the first active region RX1, and the second lower epi-pattern SPO2 may overlap the second active region RX2. The first and second lower epi-patterns SPO1 and SPO2 may be epitaxial patterns formed by, in some embodiments, an epitaxial growth process. The first lower epi-pattern SPO1 may be provided in a first recess region RS1 of the substrate 100, and the second lower epi-pattern SPO2 may be provided in a second recess region RS2 of the substrate 100.

Third active patterns AP3 may be provided above (in the third direction Z) the first active region RX1, and fourth active patterns AP4 may be provided above (in the third direction Z) the second active region RX2. Each of the third and fourth active patterns AP3 and AP4 may have a fin shape protruding vertically. From the planar viewpoint, each of the third and fourth active patterns AP3 and AP4 may have a bar shape extending in the second direction Y. The third active patterns AP3 may be arranged along the first direction X, and the fourth active patterns AP4 may be arranged along the first direction X.

Each of the third active patterns AP3 may include a first channel pattern CHP1 protruding vertically from the first lower epi-pattern SPO1, and a first upper epi-pattern DOP1 on the first channel pattern CHP1. Each fourth active pattern AP4 may include a second channel pattern CHP2 protruding vertically from the second lower epi-pattern SPO2, and a second upper epi-pattern DOP2 on the second channel pattern CHP2.

An element isolation film ST may be provided on the substrate 100 to fill the trench TR. The element isolation film ST may at least partially cover the upper surfaces of the first and second lower epi-patterns SPO1 and SPO2 in a planar view. The third and fourth active patterns AP3 and AP4 may protrude vertically upward (in the third direction Z) from the element isolation film ST.

A plurality of second gate electrodes 320 extending parallel to each other in the second direction Y may be provided on the element isolation film ST. The second gate electrodes 320 may be arranged along the first direction X. The second gate electrode 320 may wrap the first channel pattern CHP1 of the third active pattern AP3, and may wrap the second channel pattern CHP2 of the fourth active pattern AP4. For example, the first channel pattern CHP1 of the third active pattern AP3 may have first to fourth side walls SW1 to SW4. The first and second side walls SW1 and SW2 may be opposite to each other in the first direction X, and the third and fourth side walls SW3 and SW4 may be opposite to each other in the second direction Y. The second gate electrode 320 may be provided on the first to fourth side walls SW1 to SW4. That is to say, the second gate electrode 320 may surround the first to fourth side walls SW1 to SW4 in a planar view.

A second gate insulating film 330 may be interposed between the second gate electrode 320 and the respective first and second channel patterns CHP1 and CHP2. The second gate insulating film 330 may at least partially cover the bottom surface of the second gate electrode 320 and the inner side wall of the second gate electrode 320. For example, the second gate insulating film 330 may directly cover the first to fourth side walls SW1 to SW4 of the third active pattern AP3.

The first and second upper epi-patterns DOP1 and DOP2 may protrude vertically upward (in the third direction Z) from the second gate electrode 320. The upper surface of the second gate electrode 320 may be lower (in the third direction Z) than the bottom surfaces of each of the first and second upper epi-patterns DOP1 and DOP2. That is to say, each of the third and fourth active patterns AP3 and AP4 may have a structure that protrudes vertically (in the third direction Z) from the substrate 100 and penetrates the second gate electrode 320.

The semiconductor device according to some embodiments may include vertical transistors in which carriers move in the third direction Z. For example, when a voltage is applied to the second gate electrode 320 and the transistor is turned "on", the carriers may move to the upper epi-patterns DOP1 and DOP2 from the lower epi-patterns SPO1 and SPO2 through the channel patterns CHP1 and CHP2. In the semiconductor device according to some embodiments, the second gate electrode 320 may completely surround the side walls SW1 to SW4 of the channel patterns CHP1 and CHP2 in a planar view. The transistor according to the present disclosure may be a three-dimensional field effect transistor (e.g., VFET) having a gate-all-around structure. Because the gate surrounds the channel, the semiconductor device according to some embodiments may have excellent electrical properties.

A spacer 340 that at least partially covers the second gate electrodes 320 and the third and fourth active patterns AP3 and AP4 may be provided on the element isolation film ST. The spacer 340 may include a silicon nitride film or a silicon oxynitride film. The spacer 340 may include a lower spacer 340LS, an upper spacer 340US, and a gate spacer 340GS between the lower and upper spacers 340LS and 340US.

The lower spacer 340LS may directly at least partially cover the upper surface of the element isolation film ST. The second gate electrodes 320 may be spaced apart from the element isolation film ST in the third direction Z by the lower spacer 340LS. The gate spacer 340GS may at least partially cover the upper surfaces and the outer side walls of each of the second gate electrodes 320. The upper spacer 340 may at least partially cover the first and second upper epi-patterns DOP1 and DOP2. However, the upper spacer 340US may not cover the upper surfaces of the first and second upper epi-patterns DOP1 and DOP2, and may expose the upper surfaces of the first and second upper epi-patterns DOP1 and DOP2.

A first lower interlayer insulating film 190BP may be provided on the spacer 340. The upper surface of the first lower interlayer insulating film 190BP may form substantially the same plane as the upper surfaces of the first and second upper epi-patterns DOP1 and DOP2. The first upper interlayer insulating film 190UP, the first etching stop film structure 195, the second etching stop film structure 210, and the second interlayer insulating film 191 may be stacked sequentially on the first lower interlayer insulating film 190BP. The first lower interlayer insulating film 190BP and the first upper interlayer insulating film 190UP may be included in the first interlayer insulating film 190. The first upper interlayer insulating film 190UP may at least partially cover the upper surfaces of the first and second upper epi-patterns DOP1 and DOP2.

At least one third source/drain contact 370 that penetrates the first upper interlayer insulating film 190UP and is connected to the first and second upper epi-patterns DOP1 and DOP2 may be provided. At least one fourth source/drain contact 470 that sequentially penetrates the first interlayer insulating film 190, the lower spacer 340LS and the element isolation film ST and is connected to the first and second lower epi-patterns SPO1 and SPO2 may be provided. A second gate contact 380 that sequentially penetrates the first upper interlayer insulating film 190UP, the first lower interlayer insulating film 190BP, and the gate spacer 340GS and is connected to the second gate electrode 320 may be provided.

A first etching stop film structure 195 and a second etching stop film structure 210 may be placed between the first upper interlayer insulating film 190UP and the second interlayer insulating film 191.

A first via plug 206 and a second via plug 207 may be provided inside the first etching stop film structure 195. A wiring line 205 may be provided inside the second interlayer insulating film 191 and the second etching stop film structure 210. Although the second via plug 207 and the wiring line 205 are shown as a single monolithic film, this is only for convenience of explanation, and the embodiments of the inventive concept are not limited thereto.

A detailed description of the first via plug 206, the second via plug 207, the wiring line 205, the first etching stop film structure 195, and the second etching stop film structure 210 may be substantially the same as that described using FIGS. 1 to 15 above.

FIGS. 31 to 37 are intermediate stage diagrams that illustrate a method for fabricating a semiconductor device according to some embodiments. For reference, FIGS. 31 to 37 may be cross-sectional views taken along line A-A of FIG. 1. The following fabricating method will be described from the viewpoint of a cross-sectional view.

Figure 31:
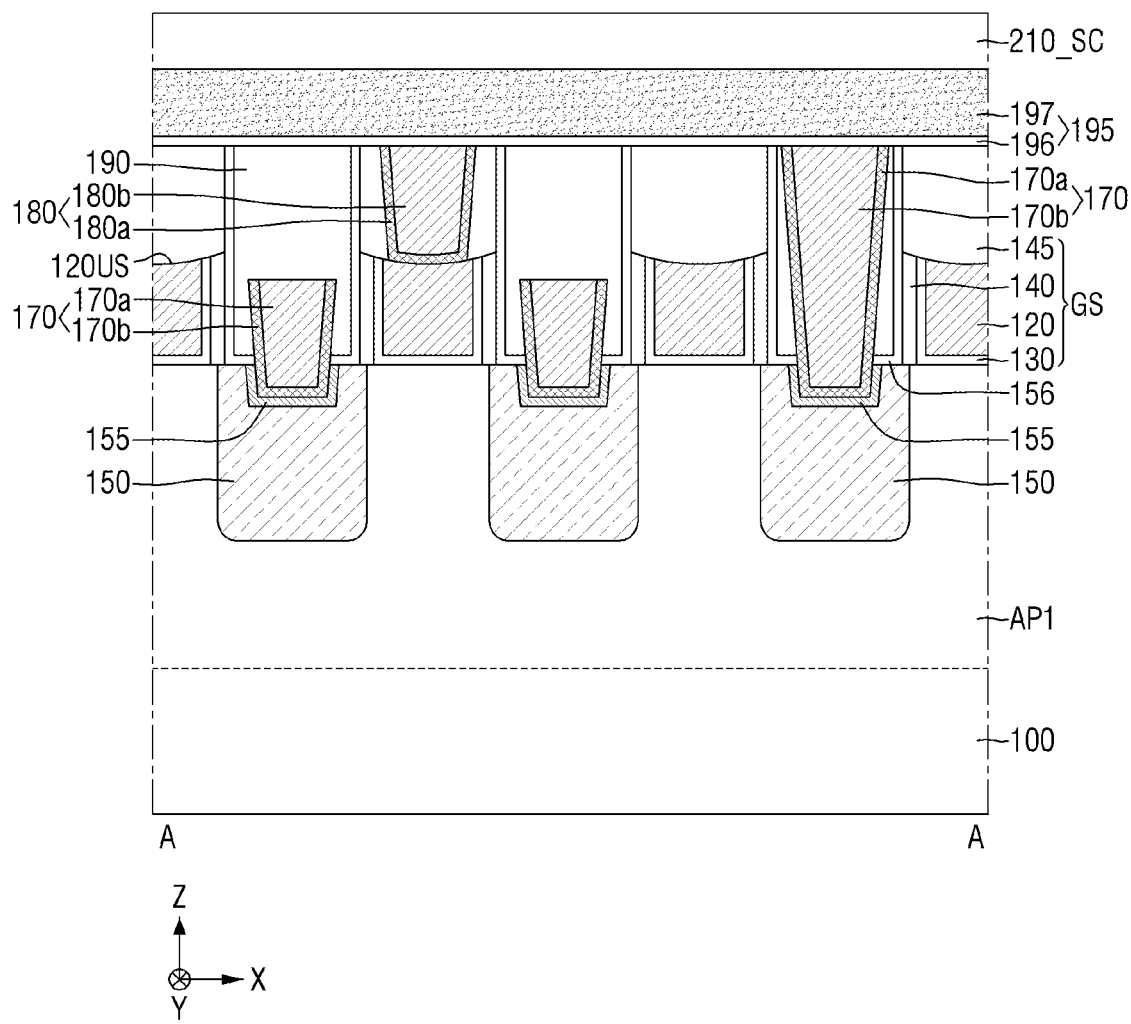
FIGS. 31 to 37 are intermediate stage diagrams that illustrate a method for fabricating a semiconductor device according to some embodiments.

Referring to FIG. 31, the gate structure GS and the first source/drain pattern 150 may be formed on the first active pattern AP1.

Subsequently, the first source/drain contact 170 may be formed on the first source/drain pattern 150. Further, the first gate contact 180 may be formed on the first gate electrode 120.

Subsequently, the first etching stop film structure 195 and a sacrificial interlayer insulating film 210_SC may be sequentially formed on the first gate contact 180 and the first source/drain contact 170.

The first etching stop film structure 195 includes a first lower etching stop film 196 and a silicon nitride film 197.

The sacrificial interlayer insulating film 210_SC may include, but is not limited to, for example, silicon oxide.

Figure 32:
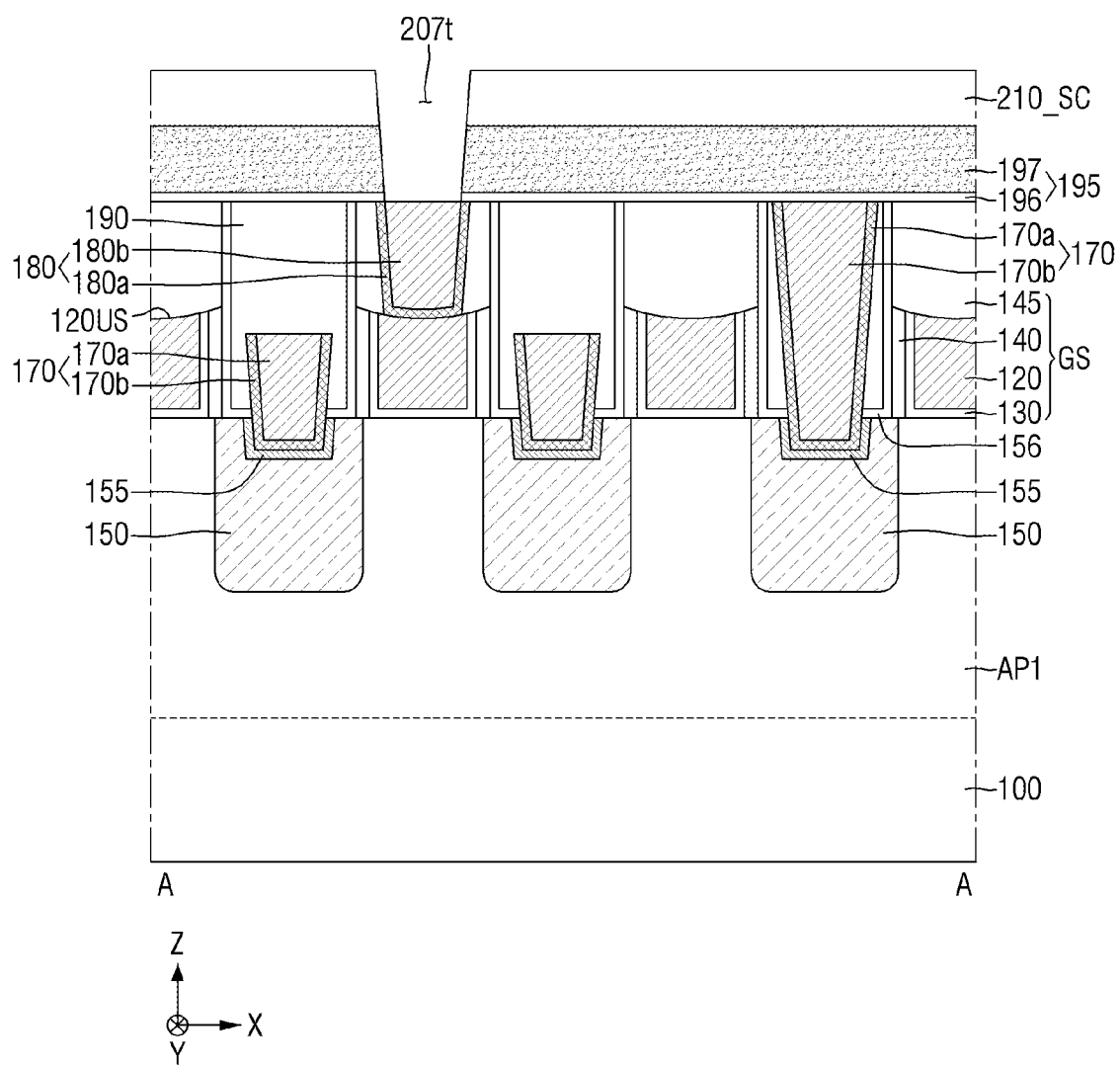

Referring to FIG. 32, a second via hole 207t that penetrates the sacrificial interlayer insulating film 210_SC and the first etching stop film structure 195 may be formed.

The second via hole 207t may expose the first gate contact 180.

Figure 33:
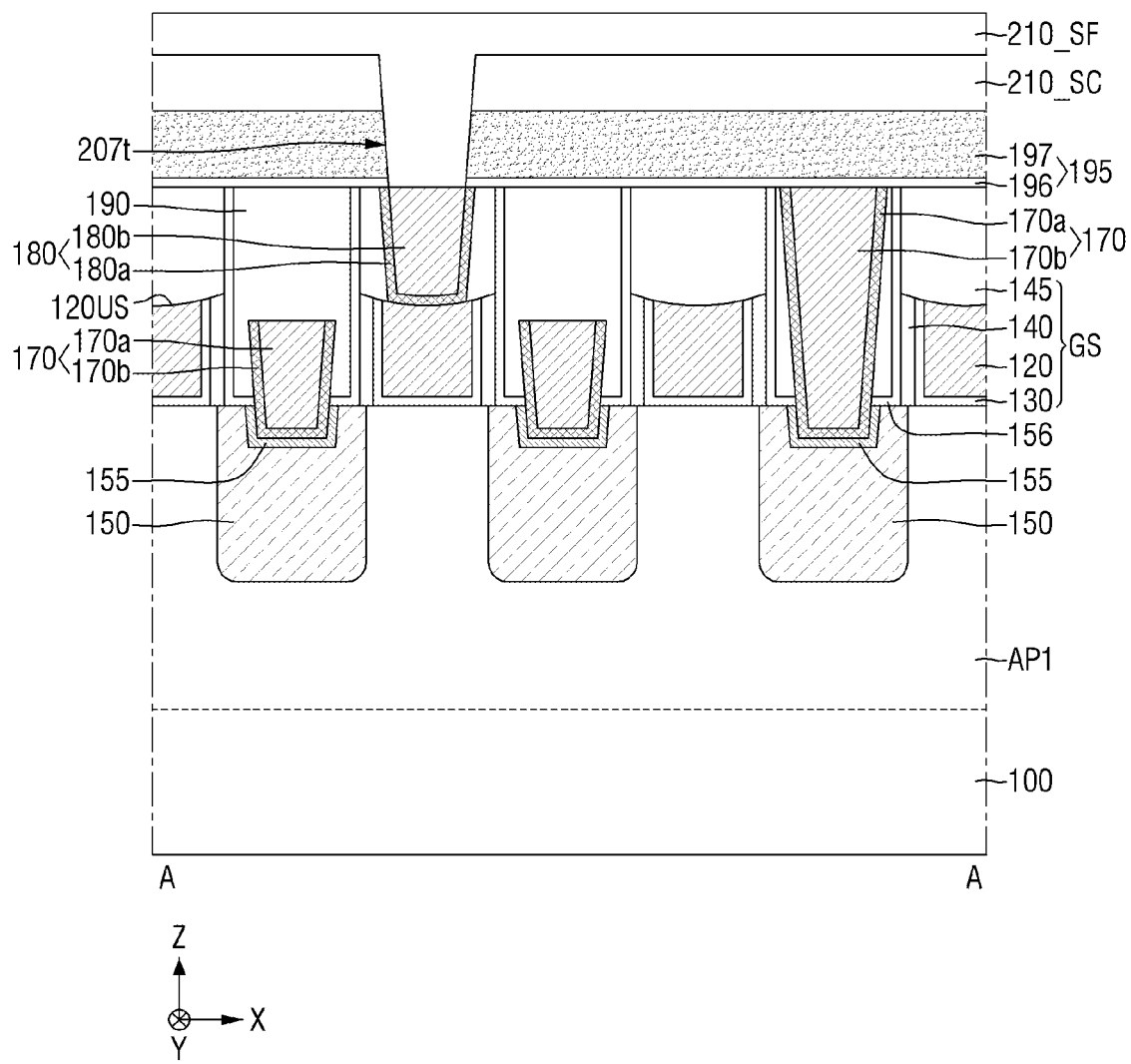

Referring to FIG. 33, a sacrificial filling film 210_SF may be formed on the sacrificial interlayer insulating film 210_SC.

The sacrificial filling film 210_SF at least partially fills the second via hole 207t. The sacrificial filling film 210_SF may at least partially cover the upper surface of the sacrificial interlayer insulating film 210_SC.

Figure 34:
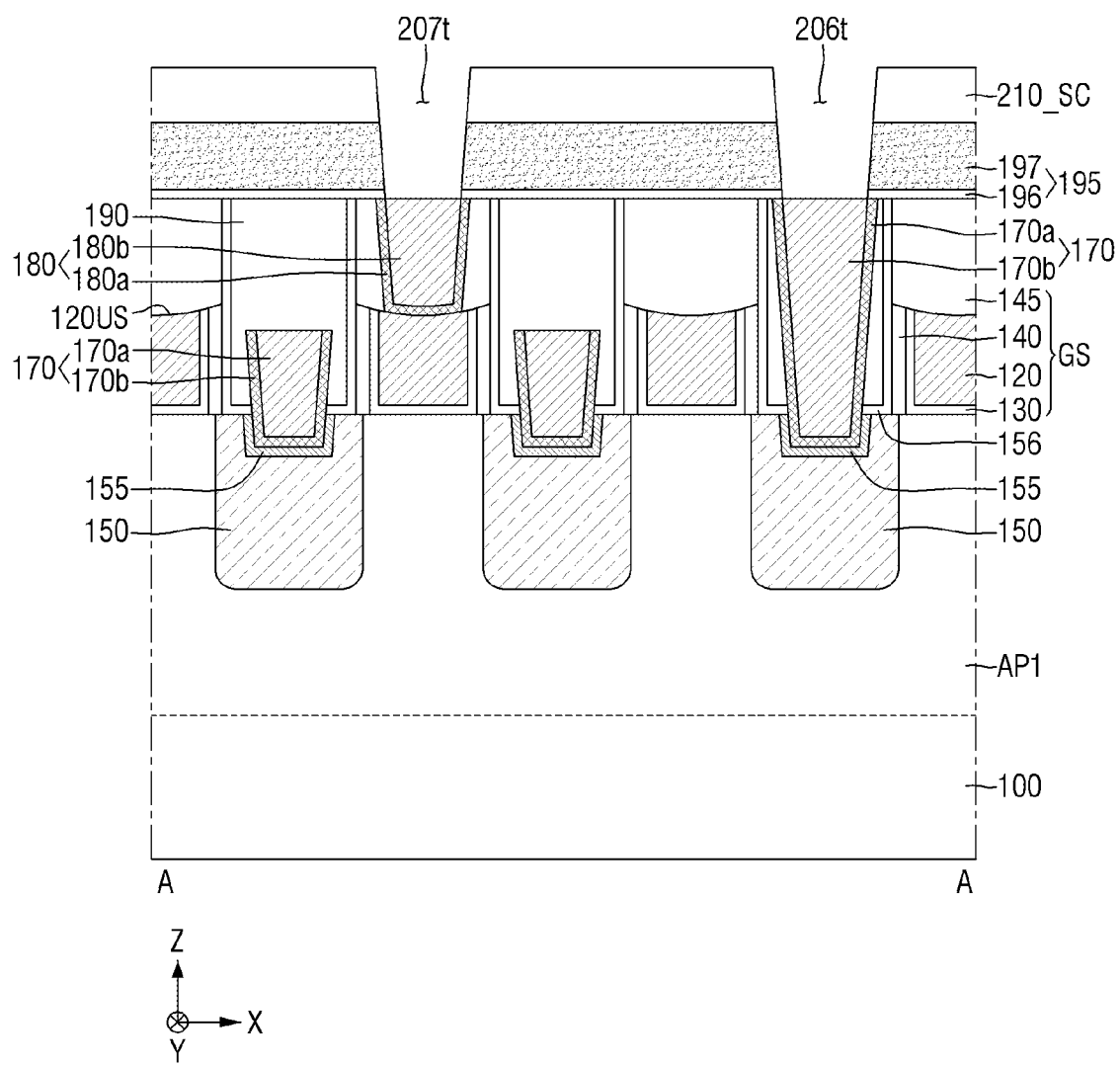

Referring to FIG. 34, a first via hole 206t that penetrates the sacrificial interlayer insulating film 210_SC and the first etching stop film structure 195 may be formed.

The first via hole 206t may expose the first source/drain contact 170.

As an example, the first via hole 206t may be formed in a state in which the sacrificial filling film 210_SF at least partially covers the upper surface of the sacrificial interlayer insulating film 210_SC.

As another example, the first via hole 206t may be formed in the state in which the sacrificial filling film 210_SF on the upper surface of the sacrificial interlayer insulating film 210_SC is removed.

After forming the first via hole 206t, the sacrificial filling film 210_SF in the second via hole 207t may be removed.

Figure 35:
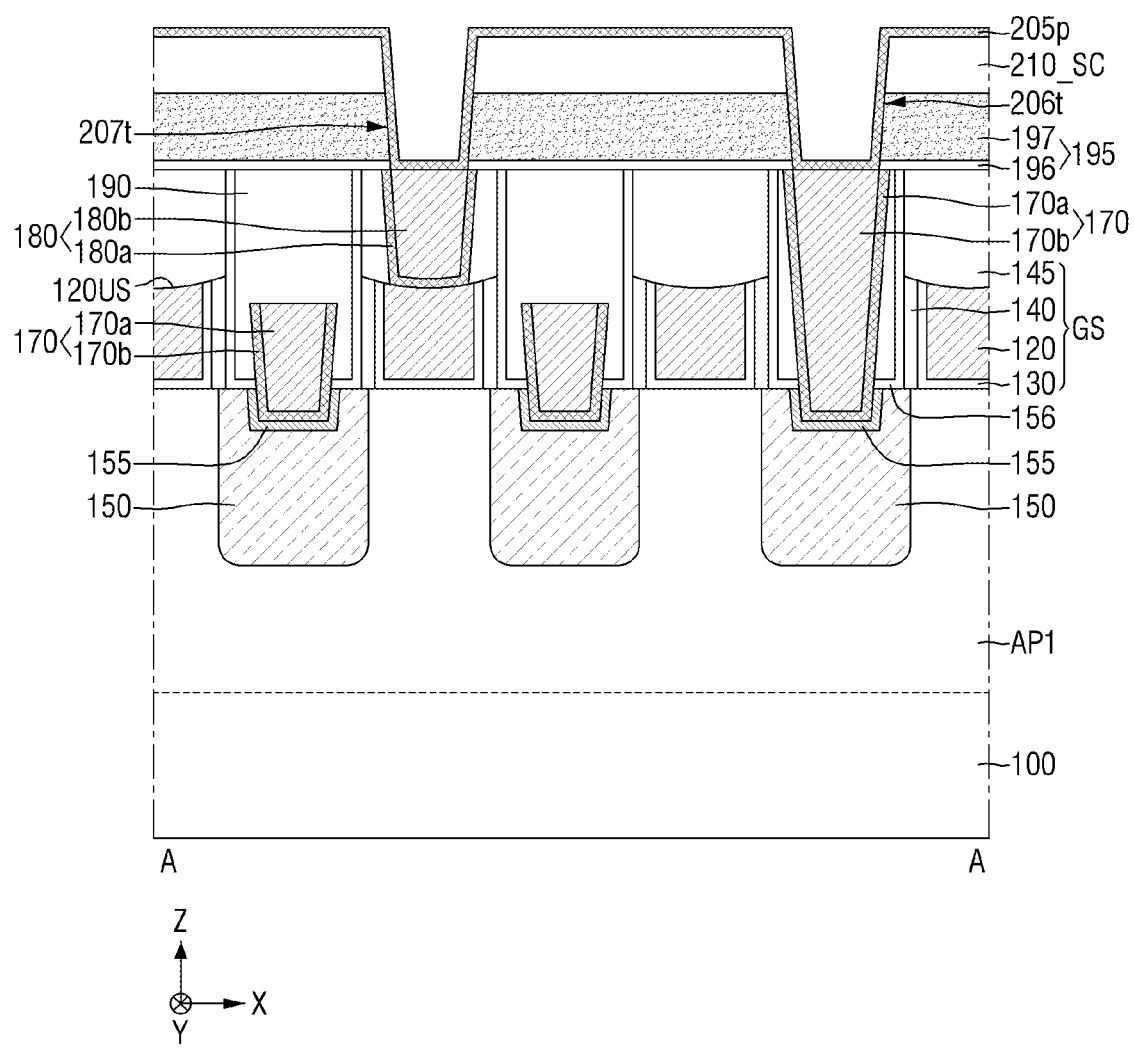

Referring to FIG. 35, a pre wiring liner 205p may be formed along the side wall and bottom surface of the first via hole 206t. The pre wiring liner 205p may be formed along the side wall and bottom surface of the second via hole 207t.

The pre wiring liner 205p may extend along the upper surface of the sacrificial interlayer insulating film 210_SC.

The pre wiring liner 205p may include, for example, the same material as the conductive material included in the first via plug (206 of FIG. 2) and the second via plug 207. For example, the pre wiring liner 205p may include tungsten.

Figure 36:
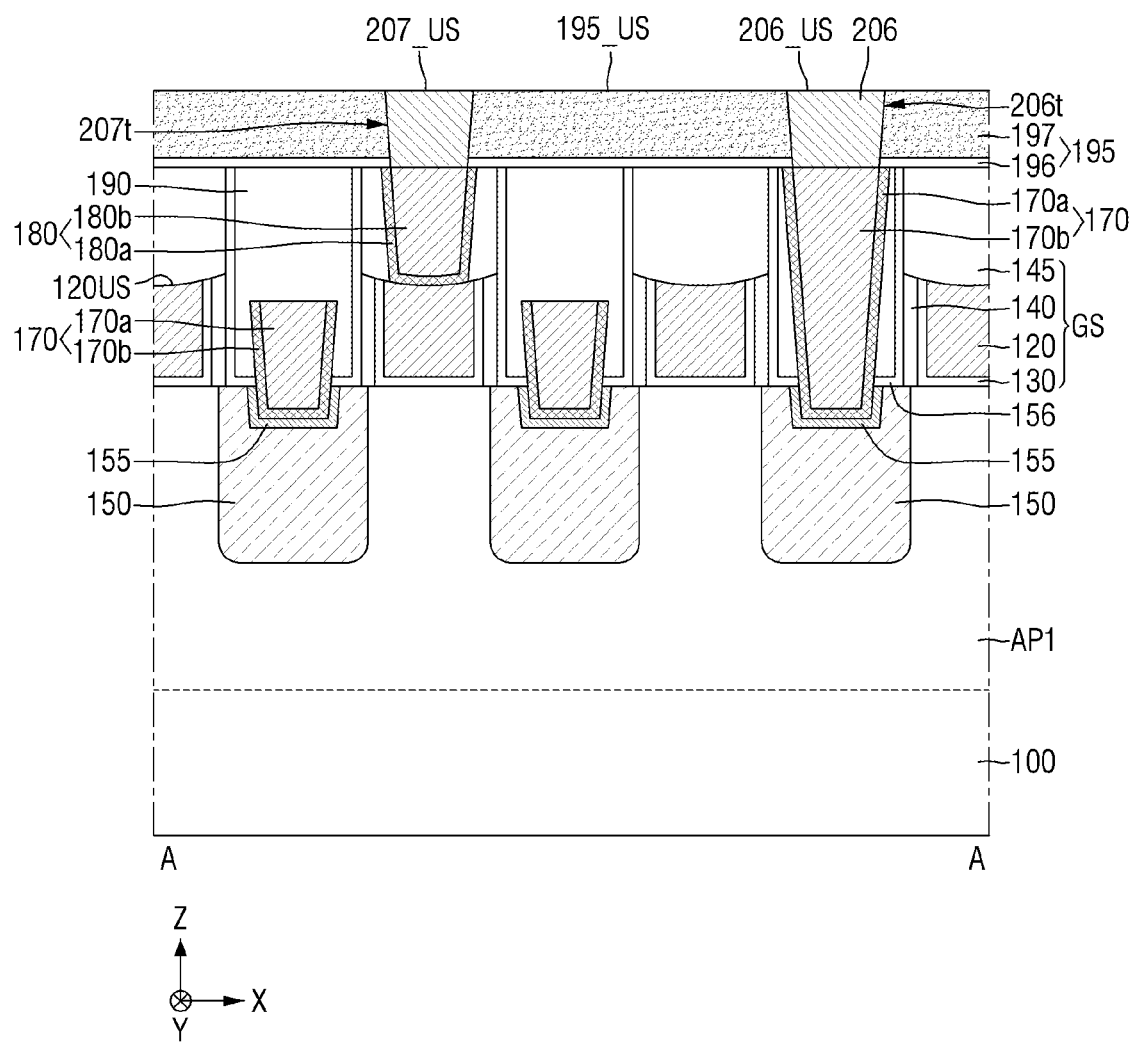

Referring to FIGS. 35 and 36, a first via plug 206 and a second via plug 207 that at least partially fills the first via hole 206t and the second via hole 207t may be formed.

More specifically, a filling conductive material that at least partially fills the first via hole 206t and the second via hole 207t is formed on the pre wiring liner 205p. The filling conductive material includes, for example, the same material as the pre wiring liner 205p.

Subsequently, until the silicon nitride film 197 is exposed, the filling conductive material and the sacrificial interlayer insulating film 210_SC may be removed, for example, through a chemical mechanical planarization (CMP). Accordingly, the first via plug 206 and the second via plug 207 are formed inside the first etching stop film structure 195.

The upper surface 206_US of the first via plug and the upper surface 207_US of the second via plug may be on the same plane as the upper surface 195_US of the first etching stop film structure.

Although the first via plug 206 and the second via plug 207 are described as being formed simultaneously through the processes shown in FIGS. 32 to 36, the embodiments of the inventive concept are not limited thereto. The first via plug 206 and the second via plug 207 may be formed through different fabricating processes from each other. Further, the first via plug 206 and the second via plug 207 may include different materials from each other. In addition, the first via plug 206 and the second via plug 207 may have conductive film stacking structures different from each other.

Figure 37:
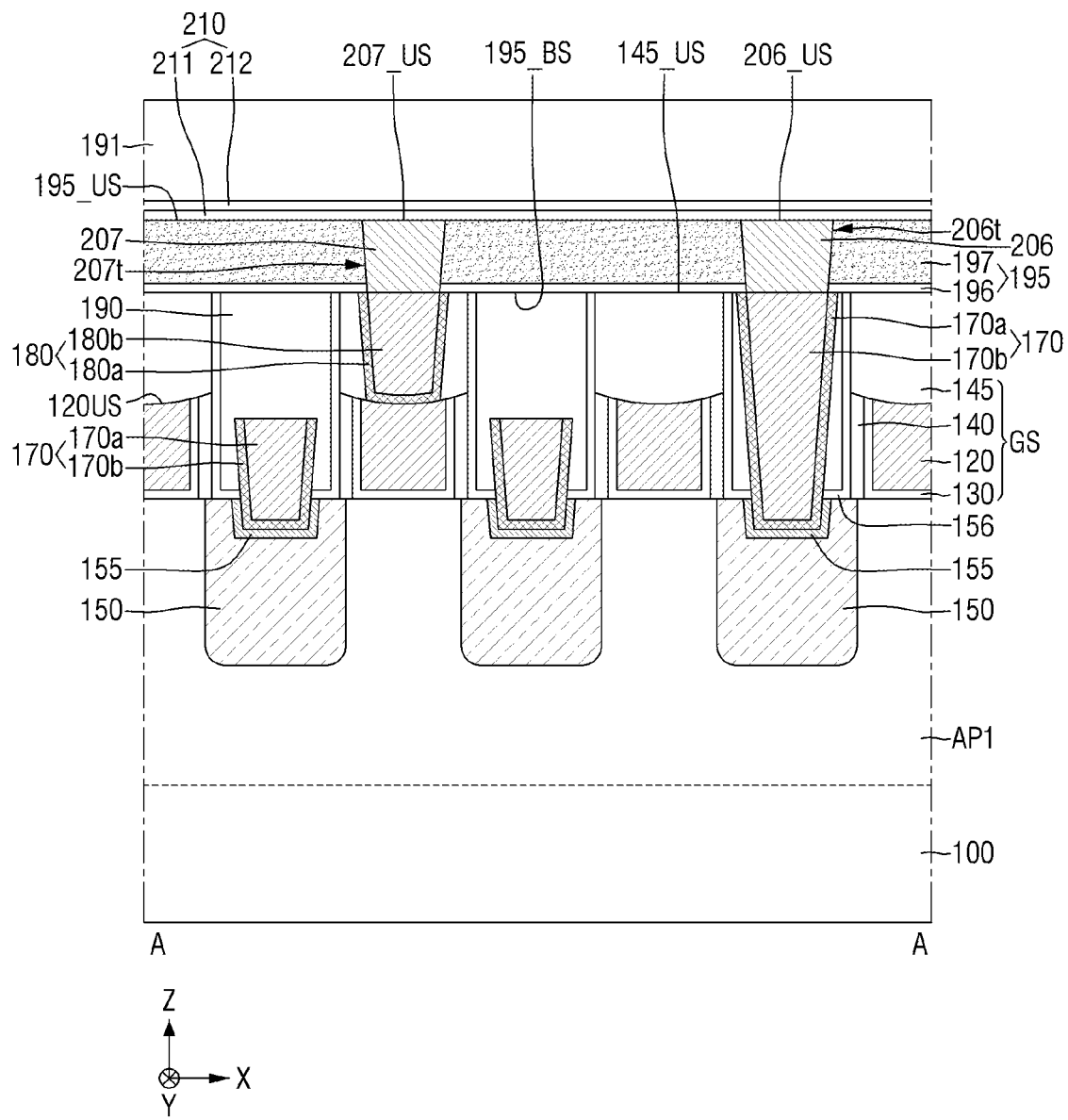

Referring to FIG. 37, the second etching stop film structure 210 is formed on the first via plug 206, the second via plug 207, and the first etching stop film structure 195.

The second etching stop film structure 210 extends along the upper surface 206_US of the first via plug, the upper surface 207_US of the second via plug, and the upper surface 195_US of the first etching stop film structure.

For example, the second etching stop film structure 210 may include a plurality of films. The second etching stop film structure 210 may include, but is not limited to, for example, a second lower etching stop film 211 and a second insertion etching stop film 212.

Subsequently, the second interlayer insulating film 191 is formed on the second etching stop film structure 210.

In FIG. 2, a wiring line 205 that penetrates the second interlayer insulating film 191 and the second etching stop film structure 210 is formed. The wiring line 205 is connected to the first via plug 206 and the second via plug 207. The wiring line 205 may be in physical contact with the silicon nitride film 197.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A semiconductor device comprising:
a gate structure on a substrate and including a gate electrode;
a gate contact connected to the gate electrode;
a source/drain pattern on a side surface of the gate electrode;
a source/drain contact connected to the source/drain pattern;
a first etching stop film structure on the source/drain contact and the gate structure, the first etching stop film structure including a first lower etching stop film and a silicon nitride film on the first lower etching stop film; and
a first via plug placed inside the first etching stop film structure and connected to the source/drain contact;
a second via plug in the first etching stop film structure and contacting an upper surface of the gate contact,
wherein the source/drain contact is between the source/drain pattern and the first via plug,
wherein the first lower etching stop film includes aluminum, and
wherein an upper surface of the silicon nitride film is on a same plane as an upper surface of the first via plug.

2. The semiconductor device of claim 1, wherein the first etching stop film structure further includes a first upper etching stop film between the first lower etching stop film and the silicon nitride film.

3. The semiconductor device of claim 1, wherein the first lower etching stop film includes aluminum nitride or aluminum oxide.

4. The semiconductor device of claim 1,
wherein an upper surface of the second via plug being on the same plane as the upper surface of the silicon nitride film.

5. The semiconductor device of claim 4, wherein a height of the first via plug and a height of the second via plug are each less than a height of the gate contact in a direction perpendicular to a plane formed by the substrate.

6. The semiconductor device of claim 4, wherein the first via plug and the second via plug each have a single conductive film structure.

7. The semiconductor device of claim 1, wherein the first via plug includes one or more width expansion regions, and
wherein a width of the width expansion region increases and then decreases with increasing distance from the substrate.

8. The semiconductor device of claim 7, wherein at least a part of the width expansion region is inside the first lower etching stop film.

9. The semiconductor device of claim 1, further comprising:
a second etching stop film structure on the first etching stop film structure, an interlayer insulating film on the second etching stop film structure, and a wiring line connected to the first via plug inside the second etching stop film structure and the interlayer insulating film,
wherein the wiring line extends along the upper surface of the silicon nitride film and is in physical contact with the upper surface of the silicon nitride film, and
wherein the second etching stop film structure includes a second lower etching stop film that includes aluminum and is in physical contact with the upper surface of the silicon nitride film.

10. The semiconductor device of claim 9, wherein the second lower etching stop film includes aluminum nitride or aluminum oxide.

11. A semiconductor device comprising:
a gate structure on a substrate and including a gate electrode;
a source/drain pattern on a side surface of the gate electrode;
a source/drain contact connected to the source/drain pattern;
a gate contact connected to the gate electrode;
a first etching stop film structure on the source/drain contact and the gate contact, the first etching stop film structure including a silicon nitride film;
a first via plug inside the first etching stop film structure and connected to the source/drain contact;
a second via plug inside the first etching stop film structure and contacting an upper surface of the gate contact; and
a wiring line that extends along a top surface of the silicon nitride film, is in physical contact with the top surface of the silicon nitride film, and is connected to the first via plug,
wherein the gate contact is between the gate electrode and the second via plug,
wherein the first via plug includes a first width expansion region, and an upper region directly connected to the first width expansion region,
wherein a width of the first width expansion region increases and then decreases with increasing distance from the substrate, and
wherein a boundary between the first width expansion region and the upper region is higher than a lower surface of the first etching stop film structure in a cross-sectional view of the semiconductor device where the substrate provides a base reference plane.

12. The semiconductor device of claim 11, wherein the top surface of the silicon nitride film is on a same plane as an upper surface of the first via plug and an upper surface of the second via plug.

13. The semiconductor device of claim 11, wherein the first etching stop film structure further includes a first lower etching stop film below the silicon nitride film in the cross-sectional view of the semiconductor device where the substrate provides the base reference plane, and
wherein the first lower etching stop film includes aluminum.

14. The semiconductor device of claim 13, wherein at least a part of the first width expansion region is inside the first lower etching stop film.

15. The semiconductor device of claim 11, wherein the first via plug further includes a second width expansion region below the first width expansion region in the cross-sectional view of the semiconductor device where the substrate provides the base reference plane,
wherein a width of the second width expansion region increases and then decreases with increasing distance from the substrate, and
wherein the second width expansion region is inside the source/drain contact.

16. The semiconductor device of claim 11, further comprising:
a second etching stop film structure on the first etching stop film structure, and an interlayer insulating film on the second etching stop film structure,
wherein the wiring line is inside the second etching stop film structure and the interlayer insulating film, and
wherein the second etching stop film structure includes a second lower etching stop film including aluminum.

17. A semiconductor device comprising:
a multi-channel active pattern on a substrate;
a gate structure on the multi-channel active pattern and including a gate electrode and a gate capping pattern on the gate electrode;
a source/drain pattern placed on a side surface of the gate structure;
a source/drain contact connected to the source/drain pattern;
a gate contact connected to the gate electrode;
a first etching stop film structure on the source/drain contact and on the gate contact, the first etching stop film structure including a silicon nitride film;
a first via plug inside the first etching stop film structure and connected to the source/drain contact;
a second via plug in the first etching stop film structure and contacting an upper surface of the gate contact;
a second etching stop film structure that is in physical contact with the first etching stop film structure;
an interlayer insulating film on the second etching stop film structure; and
a wiring line inside the second etching stop film structure and the interlayer insulating film and connected to the first via plug,
wherein the second etching stop film structure includes a second lower etching stop film that includes aluminum and is in physical contact with the silicon nitride film,
wherein a height of the first via plug and a height of the second via plug are each less than a height of the gate contact in a cross-sectional view of the semiconductor device where the substrate provides a base reference plane.

18. The semiconductor device of claim 17, wherein the first etching stop film structure further includes a first lower etching stop film below the silicon nitride film in the cross-sectional view of the semiconductor device where the substrate provides the base reference plane, and
wherein the first lower etching stop film includes aluminum.

19. The semiconductor device of claim 17, wherein the first via plug and the second via plug each include one or more width expansion regions, and
wherein a width of the width expansion region increases and then decreases with increasing distance from the substrate.

* * * * *